US011742771B2

(12) United States Patent
Mueckl et al.

(10) Patent No.: US 11,742,771 B2
(45) Date of Patent: *Aug. 29, 2023

(54) PORTABLE POWER SOURCE

(71) Applicant: MILWAUKEE ELECTRIC TOOL CORPORATION, Brookfield, WI (US)

(72) Inventors: Gareth Mueckl, Milwaukee, WI (US); Dean W. Nowalis, Franklin, WI (US); Jay J. Rosenbecker, Menomonee Falls, WI (US); Benjamin Tesch, Milwaukee, WI (US); Michael A. Matthews, Milwaukee, WI (US); Amanda M. Kachar, West Allis, WI (US); Dalton F. Hansen, Whitefish Bay, WI (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 17/688,502

(22) Filed: Mar. 7, 2022

(65) Prior Publication Data

US 2022/0190613 A1    Jun. 16, 2022

Related U.S. Application Data

(63) Continuation of application No. 16/411,291, filed on May 14, 2019, now Pat. No. 11,271,415.
(Continued)

(51) Int. Cl.
*H02J 7/00* (2006.01)
*H02M 7/00* (2006.01)
(Continued)

(52) U.S. Cl.
CPC ......... *H02M 7/003* (2013.01); *H01M 10/482* (2013.01); *H01M 10/488* (2013.01);
(Continued)

(58) Field of Classification Search
USPC ........ 320/106, 107, 108, 109, 110, 112, 114, 320/116
See application file for complete search history.

(56) References Cited

U.S. PATENT DOCUMENTS

| 5,111,127 A | 5/1992 | Johnson |
| 5,350,317 A | 9/1994 | Weaver et al. |

(Continued)

FOREIGN PATENT DOCUMENTS

| CN | 1009691 B | 9/1990 |
| CN | 2153167 Y | 1/1994 |

(Continued)

OTHER PUBLICATIONS

International Partial Search Report and Invivtation to Pay Additional Fees for Application No. PCT/US/2019/023908 dated Jun. 11, 2019, 16 pages.

(Continued)

*Primary Examiner* — Brian Ngo
(74) *Attorney, Agent, or Firm* — Michael Best & Friedrich LLP

(57) ABSTRACT

A portable power source. The portable power source includes a housing, a first battery pack support configured to receive a first removable and rechargeable battery pack, a second battery pack support configured to receive a second removable and rechargeable battery pack, an inverter within the housing, and an alternating current power outlet. The inverter is configured to receive output power from the first removable and rechargeable battery pack and the second removable and rechargeable battery pack. The inverter is configured to produce an alternating current power output. The alternating current power outlet is configured to receive the alternating current power output from the inverter. The inverter is configured to be disabled when the first removable and rechargeable battery pack is received in the first (Continued)

battery pack support and the second removable and rechargeable battery pack is not received in the second battery pack support.

20 Claims, 38 Drawing Sheets

Related U.S. Application Data

(60) Provisional application No. 62/673,716, filed on May 18, 2018.

(51) Int. Cl.
    *H05K 5/00*     (2006.01)
    *H05K 5/02*     (2006.01)
    *H01M 10/48*     (2006.01)
    *H01M 50/204*     (2021.01)
    *H01M 50/574*     (2021.01)

(52) U.S. Cl.
    CPC ....... *H01M 50/204* (2021.01); *H02J 7/00032* (2020.01); *H02J 7/0042* (2013.01); *H02J 7/0045* (2013.01); *H02J 7/0048* (2020.01); *H02J 7/0063* (2013.01); *H02J 7/00304* (2020.01); *H02J 7/00309* (2020.01); *H05K 5/0017* (2013.01); *H05K 5/0086* (2013.01); *H05K 5/023* (2013.01); *H01M 50/574* (2021.01)

(56) References Cited

U.S. PATENT DOCUMENTS

| | | |
|---|---|---|
| 5,493,197 A | 2/1996 | Eguchi et al. |
| 5,493,297 A | 2/1996 | Nguyen et al. |
| 5,631,533 A | 5/1997 | Imaseki |
| 5,739,669 A | 4/1998 | Brülhardt et al. |
| 5,742,148 A | 4/1998 | Sudo et al. |
| 5,744,936 A | 4/1998 | Kawakami |
| 5,841,265 A | 11/1998 | Sudo et al. |
| 5,910,723 A | 6/1999 | Perelle |
| 5,952,815 A | 9/1999 | Rouillard et al. |
| 5,982,138 A | 11/1999 | Krieger |
| 5,982,150 A | 11/1999 | Sudo et al. |
| 5,998,969 A | 12/1999 | Tsuji et al. |
| 5,998,974 A | 12/1999 | Sudo et al. |
| 6,014,013 A | 1/2000 | Suppanz et al. |
| 6,054,841 A | 4/2000 | Sudo et al. |
| 6,075,343 A | 6/2000 | Hsu |
| 6,087,807 A | 7/2000 | Sudo et al. |
| 6,097,177 A | 8/2000 | Sudo et al. |
| 6,104,162 A | 8/2000 | Sainsbury et al. |
| 6,121,752 A | 9/2000 | Kitahara et al. |
| 6,127,808 A | 10/2000 | Sudo et al. |
| 6,181,108 B1 | 1/2001 | Sudo et al. |
| 6,211,650 B1 | 4/2001 | Mumaw et al. |
| 6,242,890 B1 | 6/2001 | Sudo et al. |
| 6,262,561 B1 | 7/2001 | Takahashi et al. |
| 6,268,711 B1 | 7/2001 | Bearfield |
| 6,377,023 B1 | 4/2002 | Capel |
| 6,403,251 B1 | 6/2002 | Baggaley et al. |
| 6,579,215 B2 | 6/2003 | Katoh et al. |
| 6,683,439 B2 | 1/2004 | Takano et al. |
| 6,762,588 B2 | 7/2004 | Miyazaki et al. |
| 6,806,680 B2 | 10/2004 | Zeiler |
| 7,105,940 B2 | 9/2006 | Weesner et al. |
| 7,180,200 B2 | 2/2007 | Walter et al. |
| 7,190,841 B2 | 3/2007 | Takahashi |
| 7,247,954 B1 | 7/2007 | Dowdle |
| 7,336,054 B2 | 2/2008 | Crisp et al. |
| 7,626,356 B2 | 12/2009 | Elgie et al. |
| 7,667,341 B2 | 2/2010 | Serdynski et al. |
| 7,781,902 B2 | 8/2010 | Cerney et al. |
| 7,898,212 B2 | 3/2011 | Benn et al. |
| 7,992,852 B2 | 8/2011 | Marineau et al. |
| 8,080,972 B2 | 12/2011 | Smith et al. |
| 8,159,078 B2 | 4/2012 | Usselman et al. |
| 8,198,759 B2 | 6/2012 | Hurst et al. |
| 8,672,649 B2 | 3/2014 | Smith et al. |
| 8,994,336 B2 | 3/2015 | Brotto et al. |
| 9,024,570 B2 | 5/2015 | Workman et al. |
| 9,166,422 B2 | 10/2015 | Brotto et al. |
| 9,312,706 B2 | 4/2016 | Workman et al. |
| 9,344,008 B2 | 5/2016 | Brotto et al. |
| 9,385,351 B2 | 7/2016 | Workman et al. |
| 9,388,953 B2 | 7/2016 | Workman et al. |
| 9,430,370 B2 | 8/2016 | Mergener |
| 9,467,862 B2 | 10/2016 | Zeiler et al. |
| 9,515,500 B2 | 12/2016 | Workman et al. |
| 9,525,293 B2 | 12/2016 | Ito et al. |
| 9,531,199 B2 | 12/2016 | Miller et al. |
| 9,553,481 B2 | 1/2017 | Prommel et al. |
| 9,583,748 B2 | 2/2017 | Choi et al. |
| 9,643,506 B2 | 5/2017 | Lei |
| 9,899,853 B2 | 2/2018 | Marinov et al. |
| 9,991,737 B2 | 6/2018 | Mueckl et al. |
| 10,044,243 B2 | 8/2018 | Janscha et al. |
| D828,301 S | 9/2018 | Wang |
| D834,517 S | 11/2018 | Fritz et al. |
| 10,184,349 B2 | 1/2019 | Schulte |
| 10,190,223 B2 | 1/2019 | Lin |
| 10,273,864 B2 | 4/2019 | Takahashi et al. |
| 10,288,251 B2 | 5/2019 | Mestre et al. |
| 10,294,858 B2 | 5/2019 | Lan et al. |
| 10,308,358 B2 | 6/2019 | Phan et al. |
| 10,319,207 B1 | 6/2019 | Janscha et al. |
| 10,361,606 B2 | 7/2019 | Sautier et al. |
| 10,385,463 B2 | 8/2019 | Lin |
| 10,408,115 B2 | 9/2019 | Okada et al. |
| 10,439,463 B2 | 10/2019 | Allen et al. |
| 10,465,300 B2 | 11/2019 | Lin |
| 10,488,169 B2 | 11/2019 | Rastegar et al. |
| 10,495,186 B2 | 12/2019 | Lemmers, Jr. |
| 10,516,321 B2 | 12/2019 | Kobayashi |
| 10,523,092 B2 | 12/2019 | Akamatsu et al. |
| D875,943 S | 2/2020 | Dayton et al. |
| D878,293 S | 3/2020 | Beyerlein et al. |
| D879,037 S | 3/2020 | Simon et al. |
| D879,717 S | 3/2020 | Simon et al. |
| D887,005 S | 6/2020 | Lin |
| 10,811,885 B2 | 10/2020 | Fry et al. |
| D910,560 S | 2/2021 | Inskeep et al. |
| D913,226 S | 3/2021 | Tachibana et al. |
| D913,920 S | 3/2021 | Tachibana et al. |
| D920,243 S | 5/2021 | Tachibana et al. |
| D920,244 S | 5/2021 | Tachibana et al. |
| D920,909 S | 6/2021 | Sakamura et al. |
| D922,950 S | 6/2021 | Tachibana et al. |
| D928,708 S | 8/2021 | Kato et al. |
| D929,937 S | 9/2021 | Zhang et al. |
| D929,940 S | 9/2021 | Kato et al. |
| D932,430 S | 10/2021 | Li et al. |
| D932,518 S | 10/2021 | Tomczak et al. |
| D933,010 S | 10/2021 | Hansen et al. |
| 2001/0004198 A1 | 6/2001 | Matsuyama |
| 2001/0054878 A1 | 12/2001 | Odaohhara |
| 2002/0011820 A1 | 1/2002 | Suzuki et al. |
| 2002/0011822 A1 | 1/2002 | Sakai et al. |
| 2002/0089306 A1 | 7/2002 | Kubale et al. |
| 2002/0124192 A1 | 9/2002 | Odaohhara |
| 2003/0044689 A1 | 3/2003 | Miyazaki et al. |
| 2003/0227275 A1 | 12/2003 | Kishi et al. |
| 2004/0001996 A1 | 1/2004 | Sugimoto |
| 2004/0217737 A1 | 11/2004 | Popescu |
| 2005/0024021 A1 | 2/2005 | Zeiler et al. |
| 2005/0044051 A1 | 2/2005 | Selby et al. |
| 2005/0073282 A1 | 4/2005 | Carrier et al. |
| 2005/0077878 A1 | 4/2005 | Carrier et al. |
| 2005/0093514 A1 | 5/2005 | Shimizu |
| 2005/0156564 A1 | 7/2005 | Krieger |
| 2005/0226020 A1 | 10/2005 | Asbery |
| 2005/0280393 A1 | 12/2005 | Feldmann |

(56) References Cited

U.S. PATENT DOCUMENTS

| | | |
|---|---|---|
| 2006/0014054 A1 | 1/2006 | Sugawara |
| 2006/0108984 A1 | 5/2006 | Johnson et al. |
| 2006/0158037 A1 | 7/2006 | Danley et al. |
| 2006/0286442 A1 | 12/2006 | Flaugher |
| 2007/0019453 A1 | 1/2007 | Pierce |
| 2007/0080586 A1 | 4/2007 | Busick |
| 2007/0128505 A9 | 6/2007 | Yahnker et al. |
| 2007/0285055 A1 | 12/2007 | Meyer et al. |
| 2008/0003491 A1 | 1/2008 | Yahnker et al. |
| 2008/0116748 A1 | 5/2008 | Yeh |
| 2008/0180059 A1 | 7/2008 | Carrier et al. |
| 2008/0203995 A1 | 8/2008 | Carrier et al. |
| 2009/0014050 A1 | 1/2009 | Haaf |
| 2009/0140694 A1 | 6/2009 | Zeng |
| 2009/0146614 A1 | 6/2009 | Carrier et al. |
| 2010/0181966 A1 | 6/2010 | Sakakibara |
| 2012/0007446 A1 | 1/2012 | Ro |
| 2012/0025766 A1 | 2/2012 | Reade et al. |
| 2012/0202094 A1 | 8/2012 | Sada |
| 2012/0313431 A1 | 12/2012 | Shum et al. |
| 2013/0043826 A1 | 2/2013 | Workman et al. |
| 2013/0057074 A1* | 3/2013 | Takano .............. H01M 10/6551 307/66 |
| 2014/0017528 A1* | 1/2014 | Uehara ............... H01M 10/482 429/61 |
| 2014/0042975 A1 | 2/2014 | Miller et al. |
| 2014/0107853 A1 | 4/2014 | Ashinghurst et al. |
| 2014/0232343 A1 | 8/2014 | Tadd et al. |
| 2014/0287273 A1 | 9/2014 | Nguyen et al. |
| 2015/0171632 A1* | 6/2015 | Fry ....................... H02J 7/0047 307/22 |
| 2015/0226021 A1 | 8/2015 | Zhang |
| 2016/0056731 A1 | 2/2016 | Brotto et al. |
| 2016/0099575 A1 | 4/2016 | Velderman et al. |
| 2016/0198636 A1 | 7/2016 | Poole et al. |
| 2016/0261114 A1 | 9/2016 | Brotto et al. |
| 2014/0040932 A1 | 2/2017 | Lillywhite et al. |
| 2017/0040801 A1 | 2/2017 | Robinson et al. |
| 2017/0047755 A1 | 2/2017 | Workman et al. |
| 2017/0077724 A1 | 3/2017 | Clark |
| 2017/0346321 A1 | 11/2017 | Lemberg |
| 2018/0090957 A1 | 3/2018 | Rao |
| 2019/0075665 A1 | 3/2019 | Choksi et al. |
| 2019/0103805 A1 | 4/2019 | Zhu et al. |
| 2019/0109478 A1 | 4/2019 | Zhu et al. |

FOREIGN PATENT DOCUMENTS

| | | |
|---|---|---|
| CN | 2159081 Y | 3/1994 |
| CN | 2198706 Y | 5/1995 |
| CN | 2384366 Y | 6/2000 |
| CN | 2421774 Y | 2/2001 |
| CN | 1367565 A | 9/2002 |
| CN | 1402375 A | 3/2003 |
| CN | 1567645 A | 1/2005 |
| CN | 2672886 Y | 1/2005 |
| CN | 2676428 Y | 2/2005 |
| CN | 1622423 A | 6/2005 |
| CN | 1655416 A | 8/2005 |
| CN | 1972004 A | 5/2007 |
| CN | 202798104 U | 3/2013 |
| CN | 203554047 U | 4/2014 |
| CN | 104065114 A | 9/2014 |
| CN | 105593514 A | 5/2016 |
| CN | 105720624 A | 6/2016 |
| DE | 8223987 U1 | 11/1982 |
| DE | 3700092 A1 | 7/1988 |
| DE | 19545833 A1 | 6/1997 |
| DE | 19705192 A1 | 10/1997 |
| DE | 10138983 A1 | 2/2003 |
| GB | 2312571 A | 10/1997 |
| GB | 2349518 A | 11/2000 |
| JP | H0458470 A | 2/1992 |
| JP | H04105521 A | 4/1992 |
| JP | H08191547 A | 7/1996 |
| JP | H0928042 A | 1/1997 |
| JP | H0974689 A | 3/1997 |
| JP | H11234917 A | 8/1999 |
| JP | 2001157367 A | 6/2001 |
| JP | 2002247777 A | 8/2002 |
| JP | 2002281685 A | 9/2002 |
| JP | 2003061257 A | 2/2003 |
| JP | 2005150079 A | 6/2005 |
| JP | 2006050785 A | 2/2006 |
| JP | 2006254535 A | 9/2006 |
| WO | 1996017397 A1 | 6/1996 |
| WO | 1998039831 A1 | 9/1998 |
| WO | 1999025053 A1 | 5/1999 |
| WO | 2005091461 A1 | 9/2005 |
| WO | 2008010801 A2 | 1/2008 |
| WO | 2017118922 A1 | 7/2017 |
| WO | WO-2018067435 A1 * | 4/2018 .............. F02N 11/08 |

OTHER PUBLICATIONS

International Search Report for International Application No. PCT/US2019/023908 dated Aug. 2, 2019, 9 pages.

Written Opinion for International Application No. PCT/US2019/023908 dated Aug. 2, 2019, 15 pages.

DeWalt 1800 Watt Portable Power Station DCB1800, YouTube video available at <https://www.youtube.com/watch?v=-GiL2vmCB6g> accessed on Sep. 30, 2019.

DeWalt Portable Power Station & Charger—DCB1800, YouTube video available at <https://www.youtube.com/watch?v=8w-uMmkJ2KE> accessed on Sep. 30, 2019.

DeWalt Portable Power Station & 60v and 20V Charger DCB1800—First Look, YouTube video available at <https://www.youtube.com/watch?v=mPE32YCwJJA> accessed Sep. 30, 2019.

DeWalt 1800 Portable Power Station and Charger Documentation, tool was publicly available as early as Jul. 30, 2018 (37 pages).

DeWalt, "DCB1800 1800 Watt Portable Power Station with Parallel Battery Charger," Instruction Manual © 2016 (36 pages).

DeWalt 1800 Watt Portable Power Station Testing—DCB1800, YouTube video available at <https://www.youtube.com/watch?v=TDTw95y8-4c> accessed May 7, 2021.

Champion Power Equipment, "Champion Power Equipment 100813 9375/7500-Watt Portable Generator with Electric Start," <http://www.amazon.com/Champion-7500-Watt-Portable-Generator-Electric/dp/B0812DHXJH?th-1> web page publicly available at least as early as Jan. 7, 2022.

Northern Tool, "Powerhorse Portable Generator—11,050 Surge Watts, 8400 Rated Watts, Electric Start," <https://www.northerntool.com/shop/tools/product_200913128_200913128> web page publicly available at least as early as Jan. 7, 2022.

Northern Tool, "Generac Portable Generator—10,000 Surge Watts, 8000 Rated Watts, Electric Start, Model# 7686," <https://www.northerntool.com/shop/tools/product_200736934_200736934> web page publicly available at least as early as Jan. 7, 2022.

Document depicting images of portable generators, compiled and cited by the Patent Examiner as non-patent literature in Design U.S. Appl. No. 29/803,187, dated Jan. 7, 2022 (60 pages including statement of relevance).

Chinese Patent Office Action for Application No. 201910419572.6 dated Aug. 12, 2022 (9 pages including machine English translation).

* cited by examiner

PORTABLE POWER SOURCE

RELATED APPLICATIONS

This application is a continuation of U.S. patent application Ser. No. 16/411,291, filed May 14, 2019, now U.S. Pat. No. 11,271,415, which claims the benefit of U.S. Provisional Patent Application No. 62/673,716, filed May 18, 2018, the entire content of each of which is hereby incorporated by reference.

FIELD

The embodiments described herein relate to battery-powered portable power sources and, more particularly, to such portable power sources powered by high-power battery packs.

SUMMARY

Users of power tools, outdoor tools, and other powered equipment utilize a wide range of corded, AC products every day. These products include low- to high-powered tools and equipment, variable speed tools, and chargers for cordless batteries (referred to as "corded devices" or a "corded device"). These corded devices often do not have a suitable cordless option available. Even when cordless options are available, users may still prefer the corded devices, for example, due to additional costs associated with cordless solutions, because the users do not believe that cordless solutions can provide the performance, run-time, etc., needed to complete heavier-duty applications, etc.

In some situations, power or sufficient power may not be available at a worksite, or available power may be unreliable or insufficient for the corded device applications. Such scenarios may force the user to obtain power from distant locations where reliable power is available (e.g., through extension cords) or to utilize fuel-based power generators (which may be heavy and loud).

In some cases, the worksite may be enclosed or have inadequate ventilation inhibiting use of a generator due to the emissions from the generator. In these situations, the user may need to run a long extension cord that can decrease the performance and life of the corded AC products. This may result in decreases in productivity, continual inconvenience, an overall poor user experience, etc.

Accordingly, there may be a need for non-fuel based portable power sources that are reliable and can provide high power for extended periods of time for corded device applications.

In some independent aspects, a portable power source may be provided that will go anywhere that corded device users work and power at least a majority of the corded devices they use. The users can, for example, eliminate long extension cords, increase the performance of their corded devices, easily move from one work area to another on-site, and, ultimately, be more productive. This use of a battery-powered power source may shift perceptions of cordless capabilities, fuel progression to a cordless jobsite, drive penetration and expansion of future battery-powered devices, changing the way users do their jobs.

In one independent aspect, a portable power source may generally include a housing defining a battery pack support, a power input (e.g., an AC power input), and an AC power outlet. The portable power source may further include a circuit supported by the housing and including an input terminal on the battery pack support, an output terminal on the power outlet, and an inverter electrically connected between the input terminal and the output terminal. A battery pack may be supportable on the battery pack support and electrically connectable to the circuit. The battery pack may include a battery pack housing supportable on the battery pack support, at least one battery cell, and a battery terminal electrically connected to the battery cell and electrically connectable to the input terminal, power being transferrable from the battery cell to the circuit to be output through the AC power outlet.

The portable power source may include multiple battery pack supports, each operable to support one of multiple battery packs, the supported battery packs being connected in series and operable to provide DC power to the inverter. The circuit may include charging circuitry operable to charge the multiple series-connected battery packs. The power input may be used to charge the series-connected battery packs and to provide power to the AC power outlet. When power is not detected at the power input, the series-connected battery packs may provide power to the inverter to provide power to the AC power outlet.

Embodiments described herein provide a portable power source. The portable power source includes a housing, a first battery pack support configured to receive a first removable and rechargeable battery pack, a second battery pack support configured to receive a second removable and rechargeable battery pack, an inverter within the housing, and an alternating current power outlet. The inverter is configured to receive output power from the first removable and rechargeable battery pack and the second removable and rechargeable battery pack. The inverter is configured to produce an alternating current power output. The alternating current power outlet is configured to receive the alternating current power output from the inverter. The inverter is configured to be disabled when the first removable and rechargeable battery pack is received in the first battery pack support and the second removable and rechargeable battery pack is not received in the second battery pack support.

Embodiments described herein provide a portable power source. The portable power source includes a housing, a first battery pack support configured to receive a first removable and rechargeable battery pack, a second battery pack support configured to receive a second removable and rechargeable battery pack, a third battery pack support configured to receive a third removable and rechargeable battery pack, and a fourth battery pack support configured to receive a fourth removable and rechargeable battery pack. The portable power source also includes an inverter within the housing and an alternating current power outlet. The inverter is configured to receive output power from the first removable and rechargeable battery pack, the second removable and rechargeable battery pack, the third removable and rechargeable battery pack, and the fourth removable and rechargeable battery pack. The inverter is configured to produce an alternating current power output. The alternating current power outlet is configured to receive the alternating current power output from the inverter. The inverter is configured to be disabled when the first removable and rechargeable battery pack is received in the first battery pack support, the second removable and rechargeable battery pack is received in the second battery pack support, the third removable and rechargeable battery pack is received in the third battery pack support, and the fourth removable and rechargeable battery pack is not received in the fourth battery pack support.

Embodiments described herein provide a portable power source. The portable power source includes a housing, a first battery pack support configured to receive a first removable and rechargeable battery pack, a second battery pack support configured to receive a second removable and rechargeable battery pack, a third battery pack support configured to receive a third removable and rechargeable battery pack, and a fourth battery pack support configured to receive a fourth removable and rechargeable battery pack. The portable power source also includes an inverter within the housing, an alternating current power outlet, and a user interface. The inverter is configured to receive output power from the first removable and rechargeable battery pack, the second removable and rechargeable battery pack, the third removable and rechargeable battery pack, and the fourth removable and rechargeable battery pack. The inverter is configured to produce an alternating current power output. The alternating current power outlet is configured to receive the alternating current power output from the inverter. The user interface includes a fuel gauge. The fuel gauge is configured to display information associated with at least one of the first removable and rechargeable battery pack, the second removable and rechargeable battery pack, the third removable and rechargeable battery pack, and the fourth removable and rechargeable battery pack. The fuel gauge is also configured to display an indication corresponding to which of the at least one of the first removable and rechargeable battery pack, the second removable and rechargeable battery pack, the third removable and rechargeable battery pack, and the fourth removable and rechargeable battery pack the information is associated.

Before any independent embodiments of the are explained in detail, it is to be understood that the embodiments described herein are not limited in their application to the details of construction and the arrangement of components set forth in the following description or illustrated in the following drawings. Embodiments are capable of being practiced or of being carried out in various ways. Also, it is to be understood that the phraseology and terminology used herein is for the purpose of description and should not be regarded as limiting.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed.

Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

Other independent aspects of the embodiments described herein may become apparent by consideration of the detailed description and accompanying drawings.

DETAILED DESCRIPTION

Figure 1A:
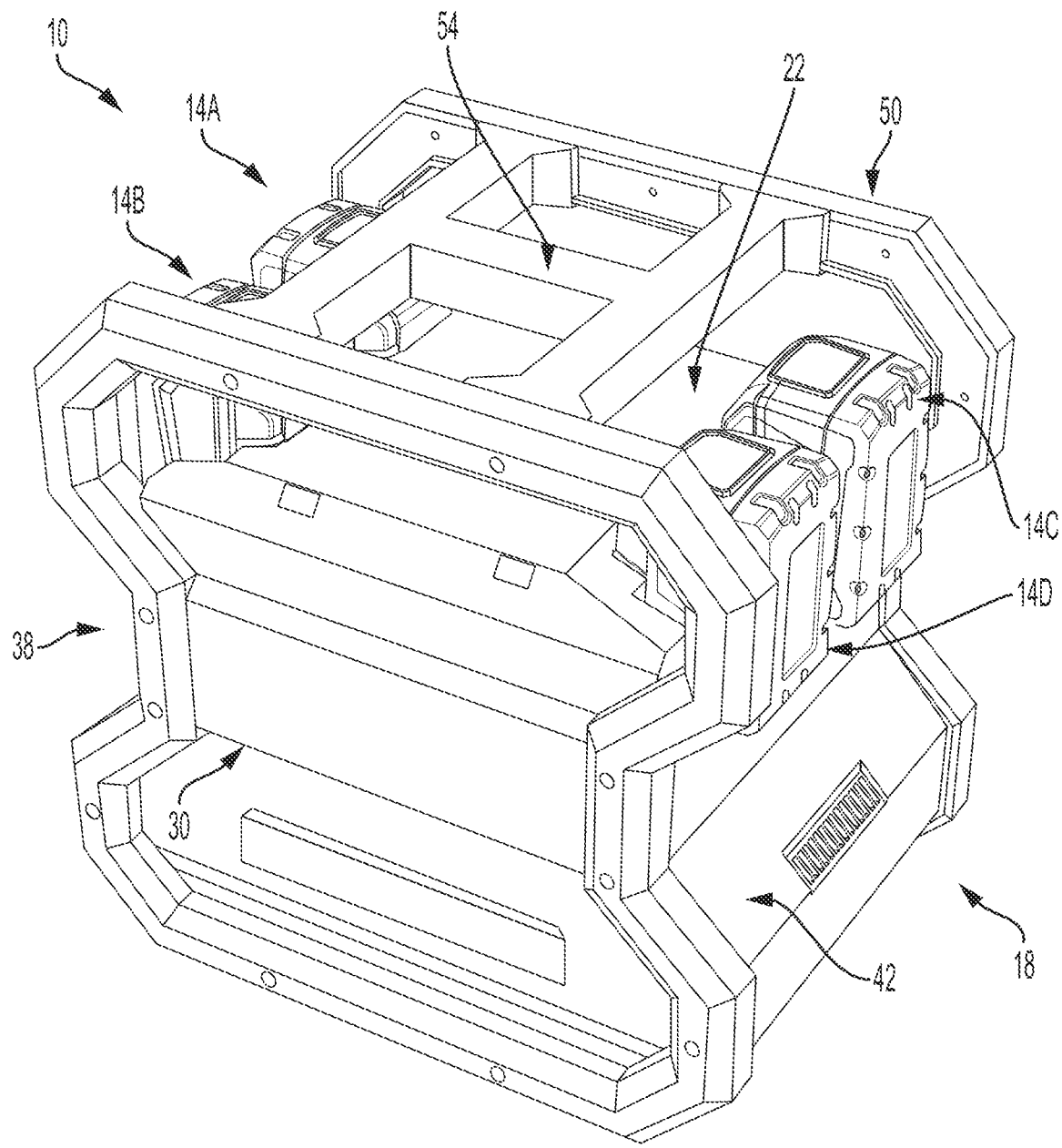
FIG. 1A is a perspective view of a portable power source, such as a battery-powered portable power source, with battery packs attached, according to embodiments described herein.
Figure 1B:
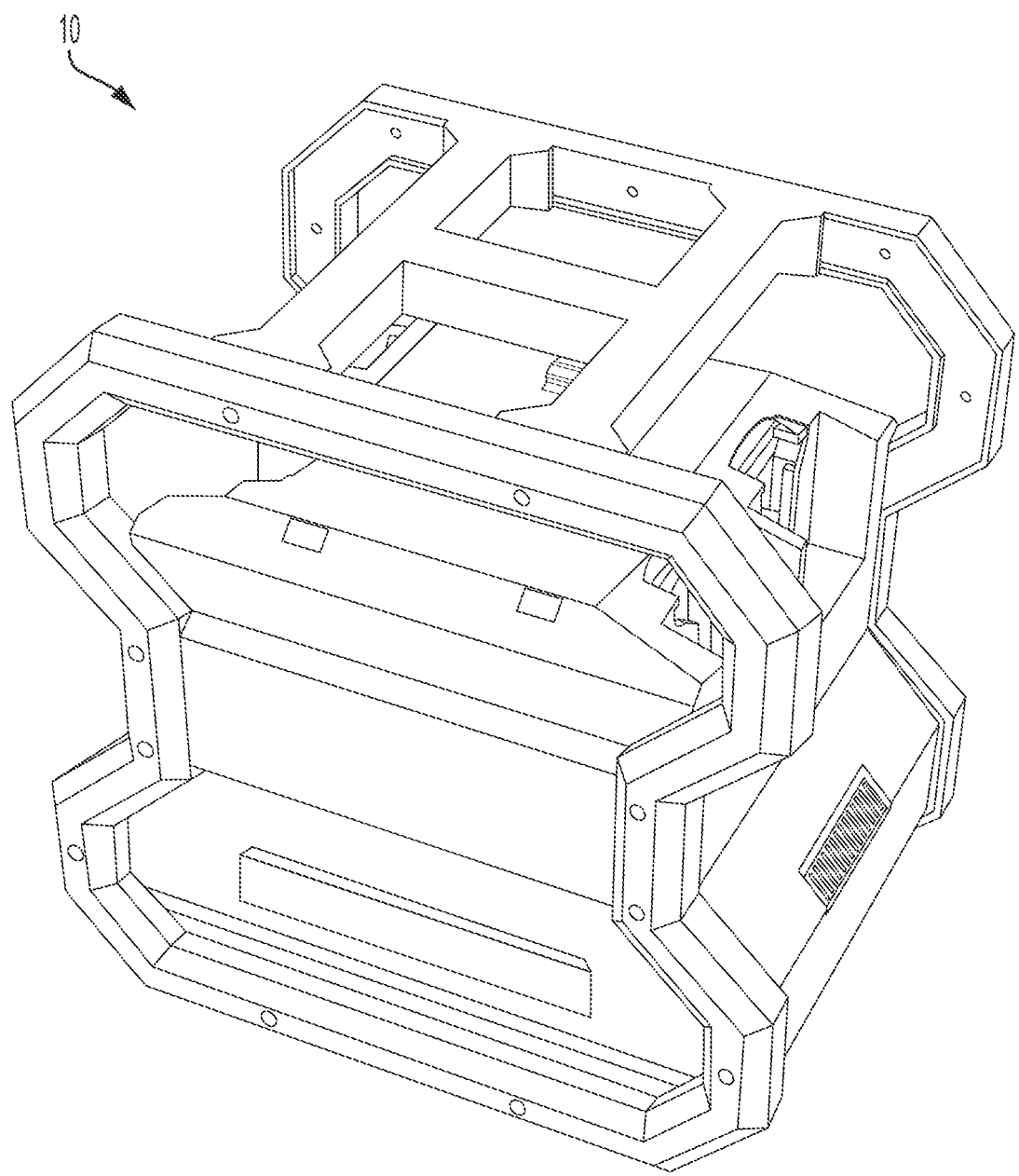
FIG. 1B is a perspective view of the portable power source of FIG. 1A, illustrated with no battery packs.

FIGS. 1A-1L show a portable power source 10 powered by one or more series-connected battery packs 14 (e.g., four battery packs 14A, 14B, 14C, 14D shown) and operable to power different corded devices, such as power tools, outdoor tools, other powered equipment (e.g., lights, chargers for cordless batteries, etc.). As discussed below in more detail, the portable power source 10 may be operated with fewer than the available battery packs 14 (e.g., with only three of the four battery packs 14 operational and/or electrically connected to the portable power source 10). The portable power source 10 may be operational only when certain ones of the battery packs 14 are operational and/or electrically connected to the portable power source 10.

The illustrated portable power source 10 includes a housing 18 having a top 22, a bottom 26, a front 30, a rear 34, and opposite sides 38, 42. For each battery pack 14, a battery pack support 46 (four in the illustrated construction) is provided on the housing 18. In the illustrated construction, a first battery pack support 46A supports a first battery pack 14A, a second battery pack support 46B supports a second battery pack 14B, and, so on, for the battery pack supports 46C, 46D and the associated battery packs 14C, 14D.

A frame 50 is connected to the housing 18. A handle 54 is connected to portions of the frame 50, and the handle 54 may include elastomeric material to improve gripping, comfort of a user during movement of the portable power source 10, etc. Rubber feet may be fixed on a bottom of the housing 18 (e.g., covering the corners), on the frame 50, etc. The feet provide a non-slip, non-scratch surface when the portable power source 10 is placed on a surface, such as a floor at a work site.

Figure 2:
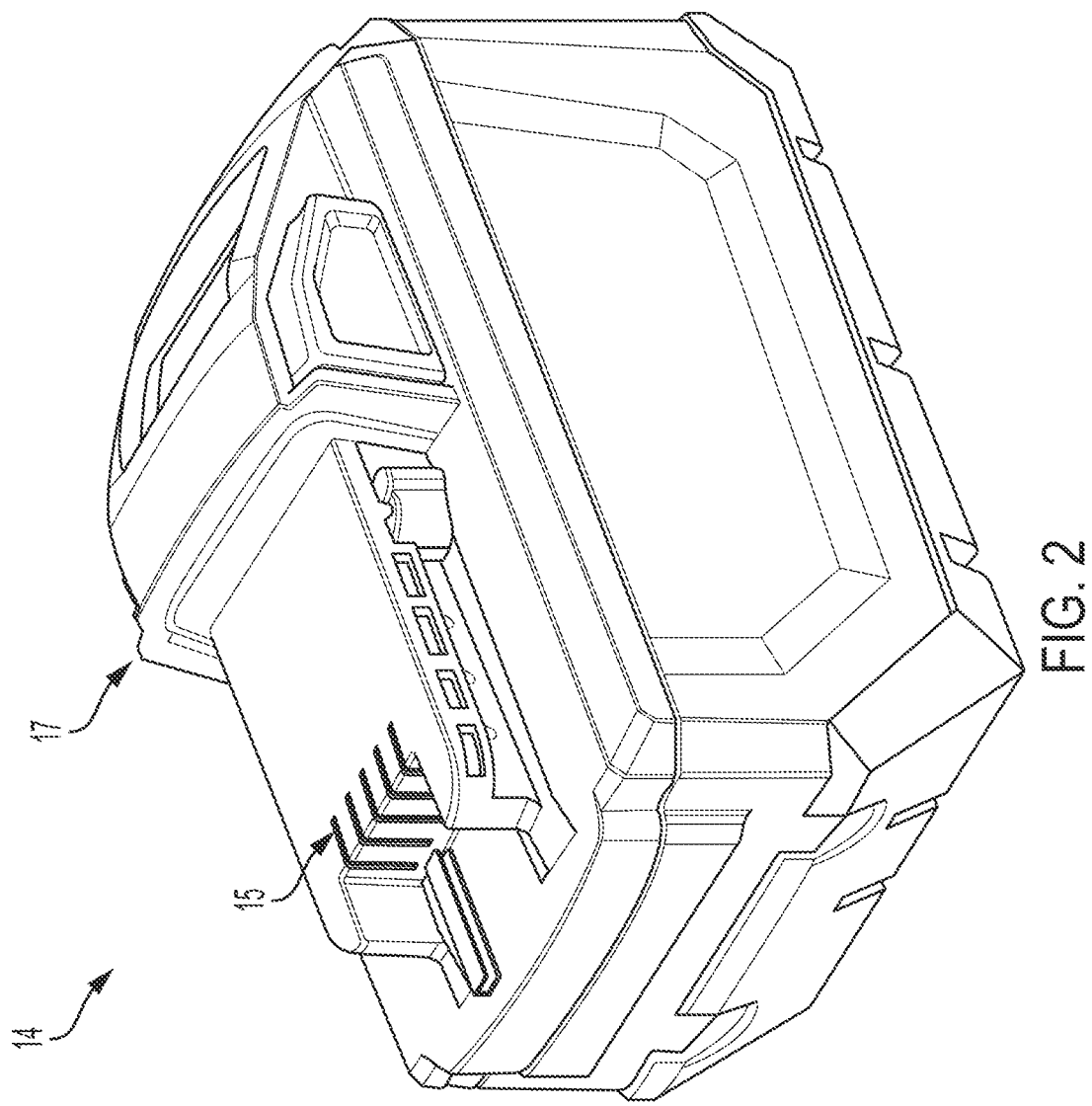
FIG. 2 is a perspective view of a battery pack to power the portable power source of FIG. 1, according to embodiments described herein.

Each battery pack 14 includes a housing 17 (see FIG. 2) supporting a number of battery cells (not shown). Battery pack terminals 15 electrically connect the battery cells to the portable power source 10. The battery pack terminals 15 may include power terminals operable to transfer power between the battery pack 14 and the portable power source 10 and communication terminals operable to transmit information between the battery pack 14 and the portable power source 10.

The battery packs 14 includes one or more cells arranged in cell strings, each having a number of battery cells (e.g., five battery cells) connected in series to provide a desired output discharge voltage (e.g., a nominal voltage [e.g., 12 V, 18 V, 20 V, 24 V, 40 V, 60 V, 80 V, 120 V, etc.] and current capacity). The battery packs 14 may include a number of cell strings connected in parallel (e.g., a single cell string "5S1P", two cell strings "5S2P", three cell strings "5S3P", etc.). In other embodiments, other combinations (series, parallel, combination series-parallel configurations) of battery cells are also possible.

Each battery cell may have a nominal voltage between 3 V and 5 V and a nominal capacity between about 3 Ah and about 5 Ah or more (e.g., up to about 9 Ah). The battery cells may be any rechargeable battery cell chemistry type, such as, for example Lithium ("Li"), Lithium-ion ("Li-ion"), other Lithium-based chemistry, Nickel-Cadmium ("NiCd"), Nickel-metal Hydride ("NiMH"), etc. Similar battery packs 14 are described and illustrated in U.S. Patent Application Publication No. 2019/0044110, filed Jul. 25, 2018 (previously filed as U.S. Provisional Patent Application No. 62/536,807, filed Jul. 25, 2017, and U.S. Provisional Patent Application No. 62/570,828, filed Oct. 11, 2017), all entitled "HIGH-POWER BATTERY-POWERED SYSTEM," the entire contents of all three of which are hereby incorporated by reference.

FIGS. 3A-3F illustrate a user interface 70 provided on the front 30 of the housing 18. In the illustrated examples, the user interface 70 includes a power button 74, AC outlets 78, USB outlets 82, over-condition indicators 86, a wireless connection indicator 90, a power input 94 (e.g., an AC power input), and fuel gauges 98A-98F.

The power button 74 may be implemented as a pushbutton, a two-way switch, a touch button, etc. The power button 74 is used to control power output to the user interface 70 and can be activated to turn the portable power source 10 ON or OFF. When the power button 74 is used to turn ON the portable power source 10, power output through the AC outlets 78 and USB outlets 82 are enabled and thus the fuel gauge 98 and the over-condition indicators 86 are activated to display indications. When the power button 74 is used to turn OFF the portable power source 10, power output through the AC outlets 78 and USB outlets 82 is disabled and the fuel gauge 98 and the over-condition indicators 86 are deactivated.

The AC outlets 78 are, for example, 15 A, 120 V AC outlets that provide a similar power output as a wall outlet. The AC outlets 126 are powered by the battery packs 14. In the illustrated example, the over-conditions indicators 86 include an over-temperature indicator 102 and an overload indicator 106. The over-temperature indicator 102 is activated when a temperature of the portable power source 10 or the battery packs 14 exceeds a predetermined temperature threshold. The overload indicator 106 is activated when a load output of the portable power source 10 exceeds a predetermined load threshold.

The wireless connection indicator 90 indicates whether the portable power source 10 is wirelessly-connected to a remote device (e.g., a smartphone or other user device). The AC input 94 may include a retractable or removable cable that can be plugged into an external power source (e.g., a 15 A, 120 V wall outlet). The AC input 94 is used to supply power to charge the battery packs 14 supported on the portable power source 10. When connected to an external power source, the portable power source 10 may pass through AC power to the AC outlets 78 in addition to charging the supported battery pack(s) 14.

Figure 3A:
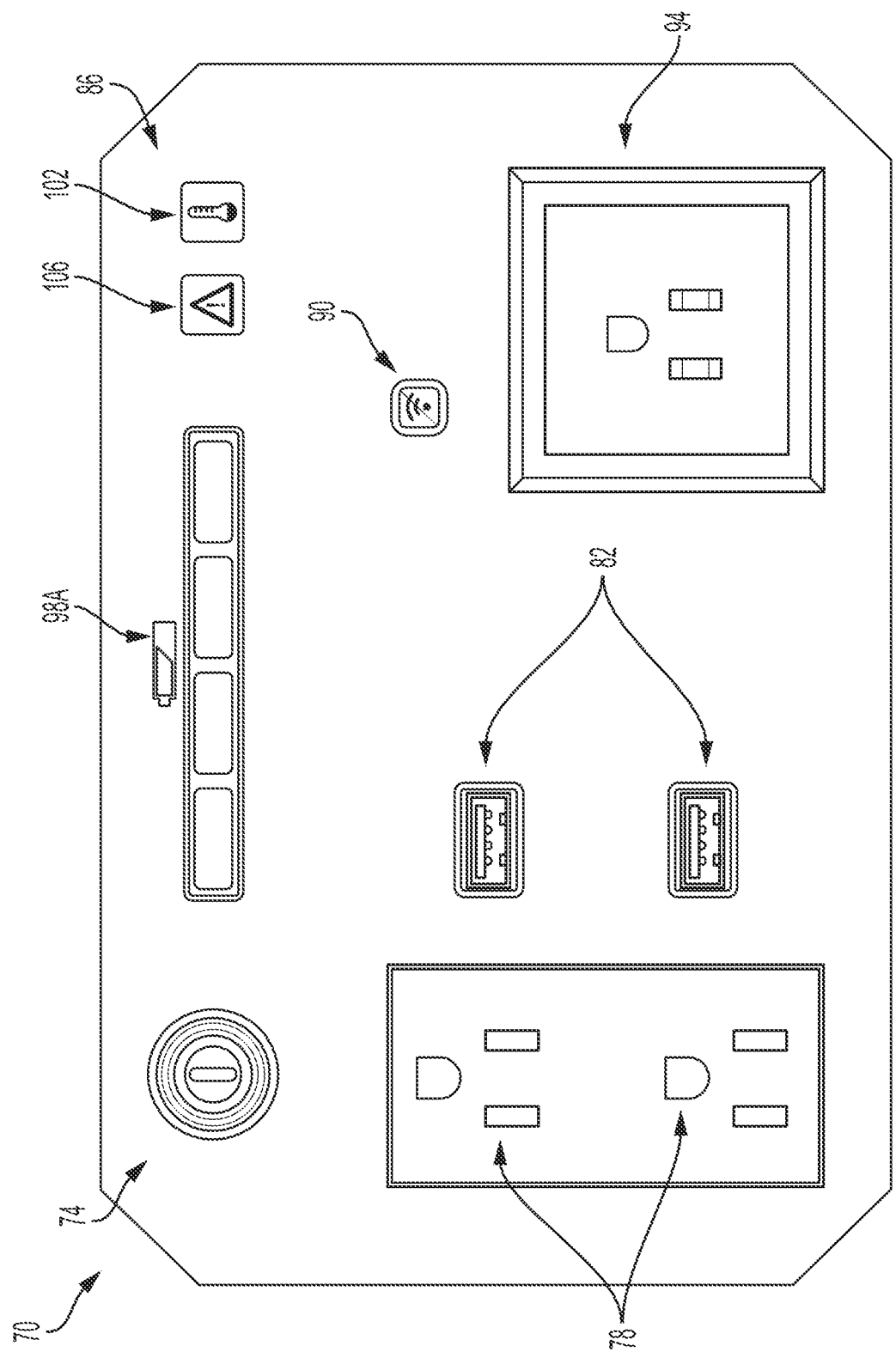
FIGS. 3A, 3B, 3C, 3D, 3E, and 3F illustrate a user interface on the front of the portable power source, according to embodiments described herein.

The fuel gauge 98 indicates the state-of-charge of the associated battery pack(s) 14. FIG. 3A illustrates a fuel gauge 98A operable to display information (e.g., the remaining state-of-charge ["SOC"], the power level, etc.) of the lowest-charged battery pack 14 without identifying which battery pack 14 is being displayed. The illustrated fuel gauge 98A may be similar to the fuel gauge on a corresponding electrical device (e.g., a drill) and similar battery packs.

Figure 3B:
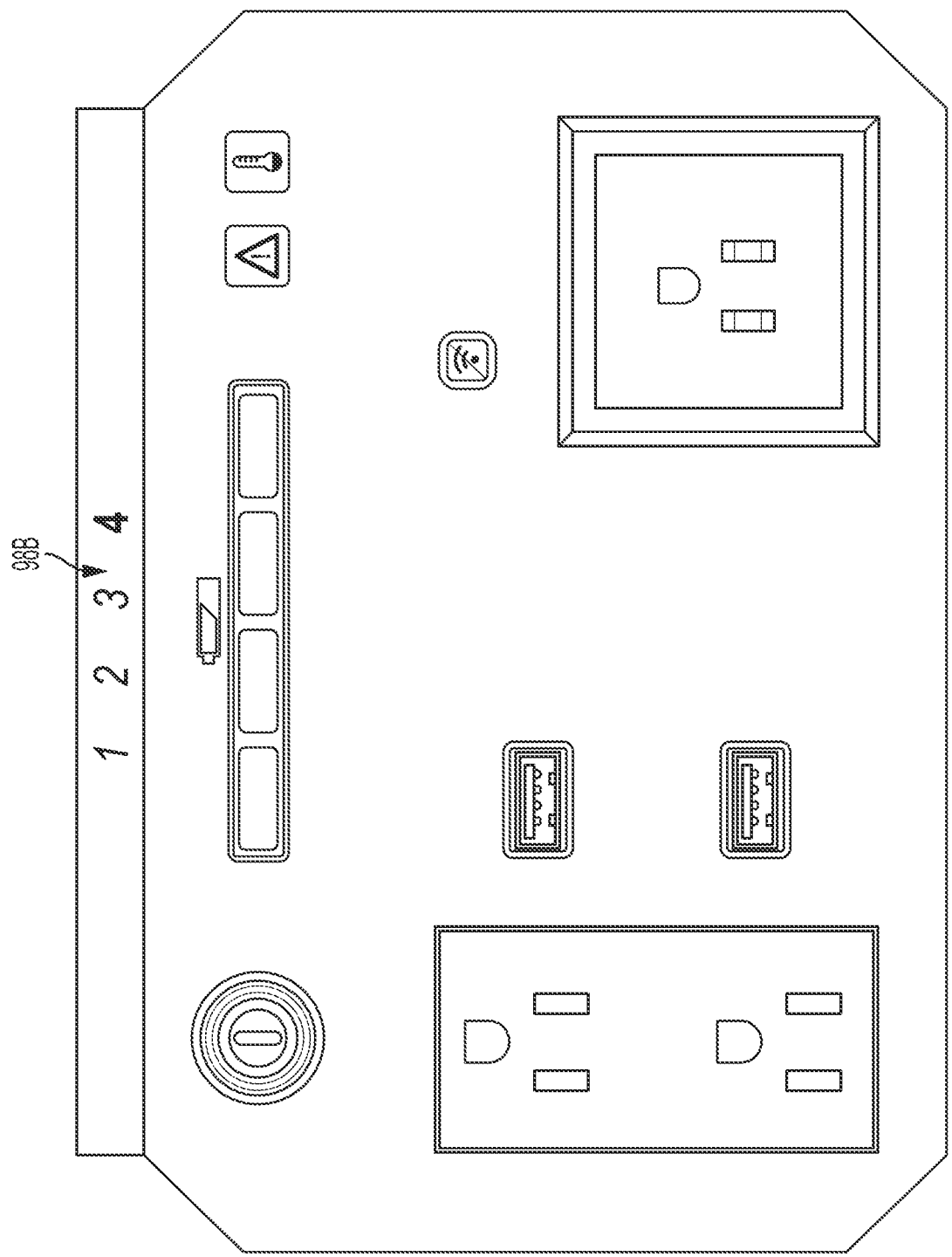
Figure 3C:
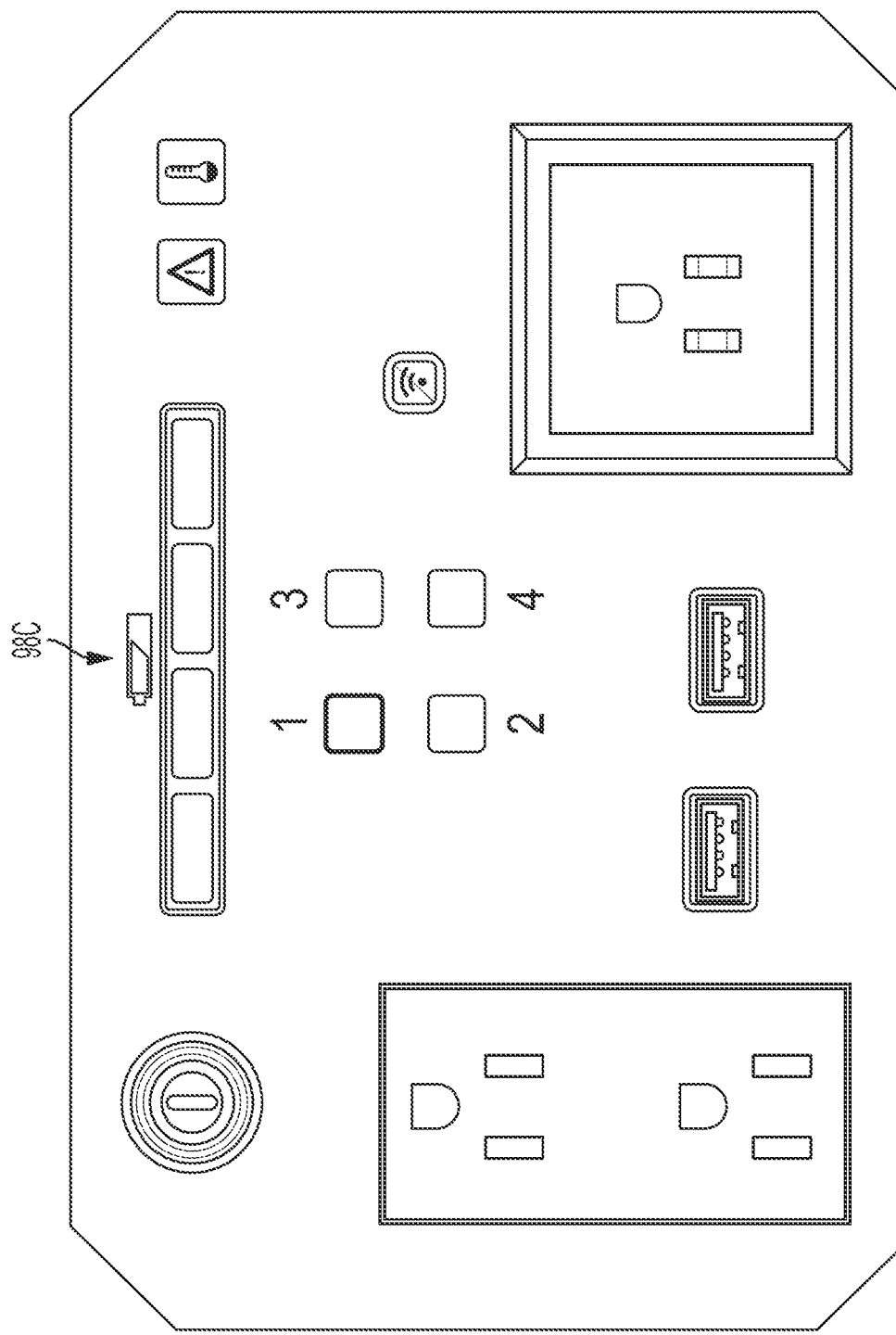
Figure 3D:
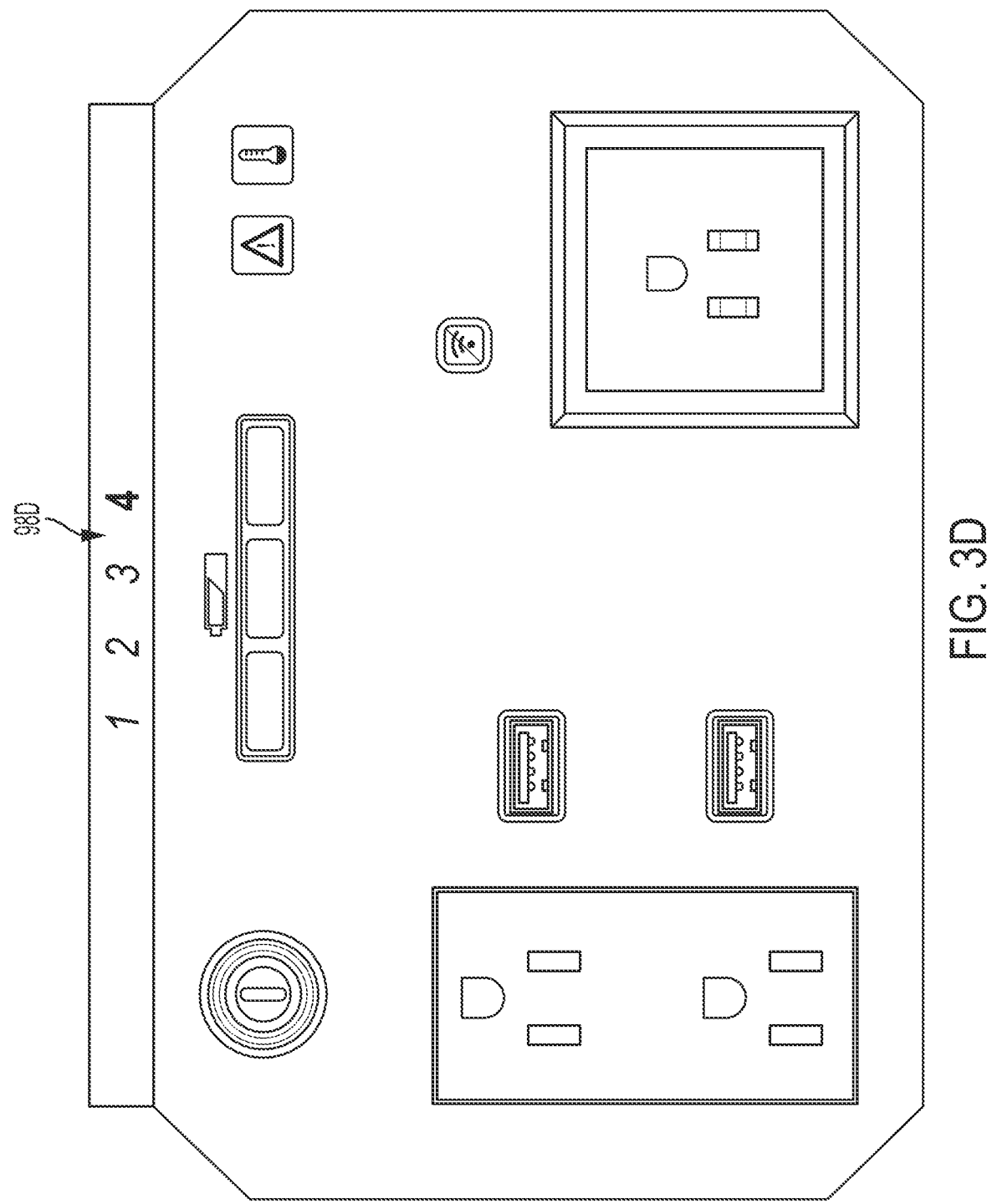
Figure 3E:
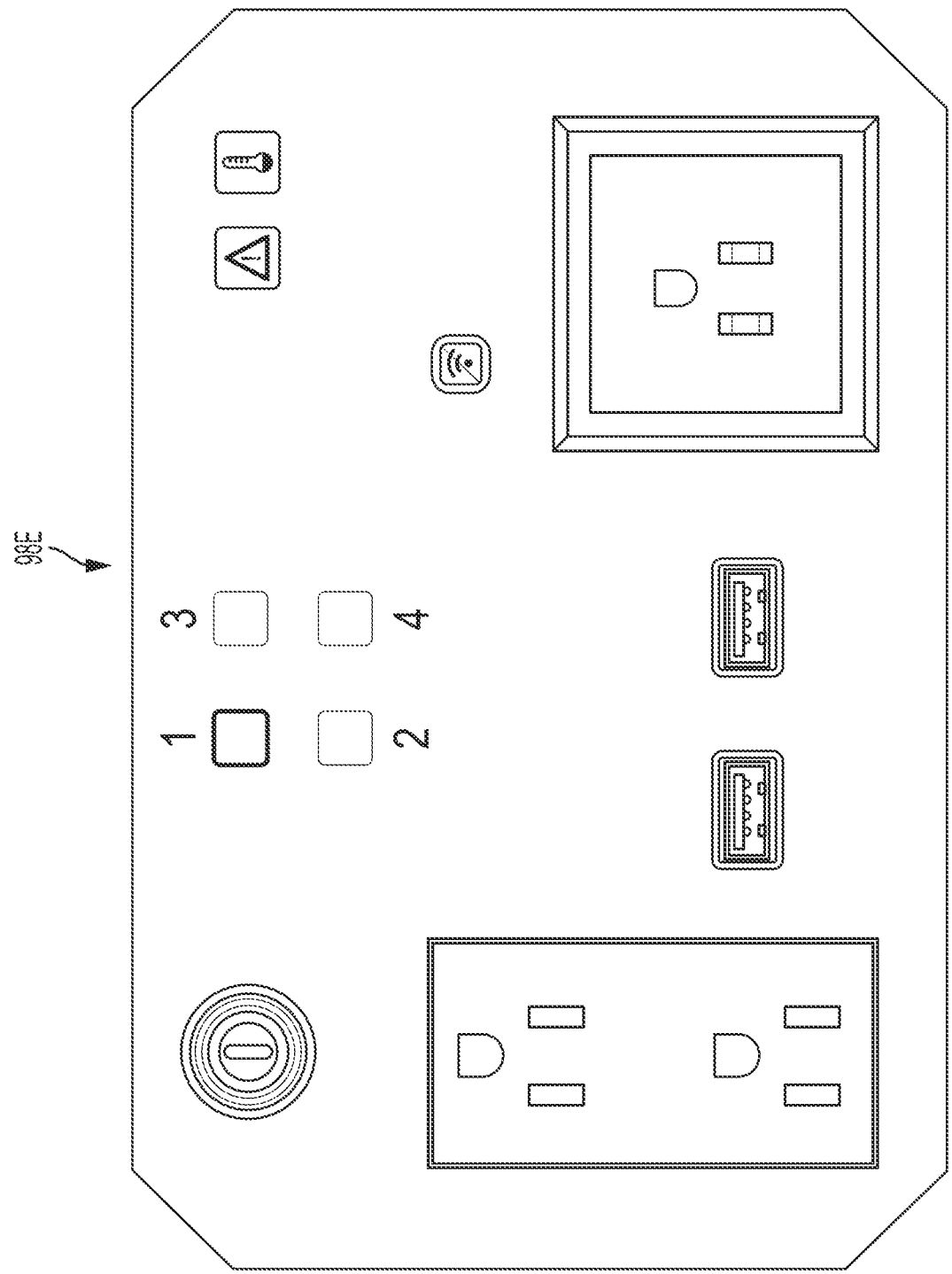
Figure 3F:
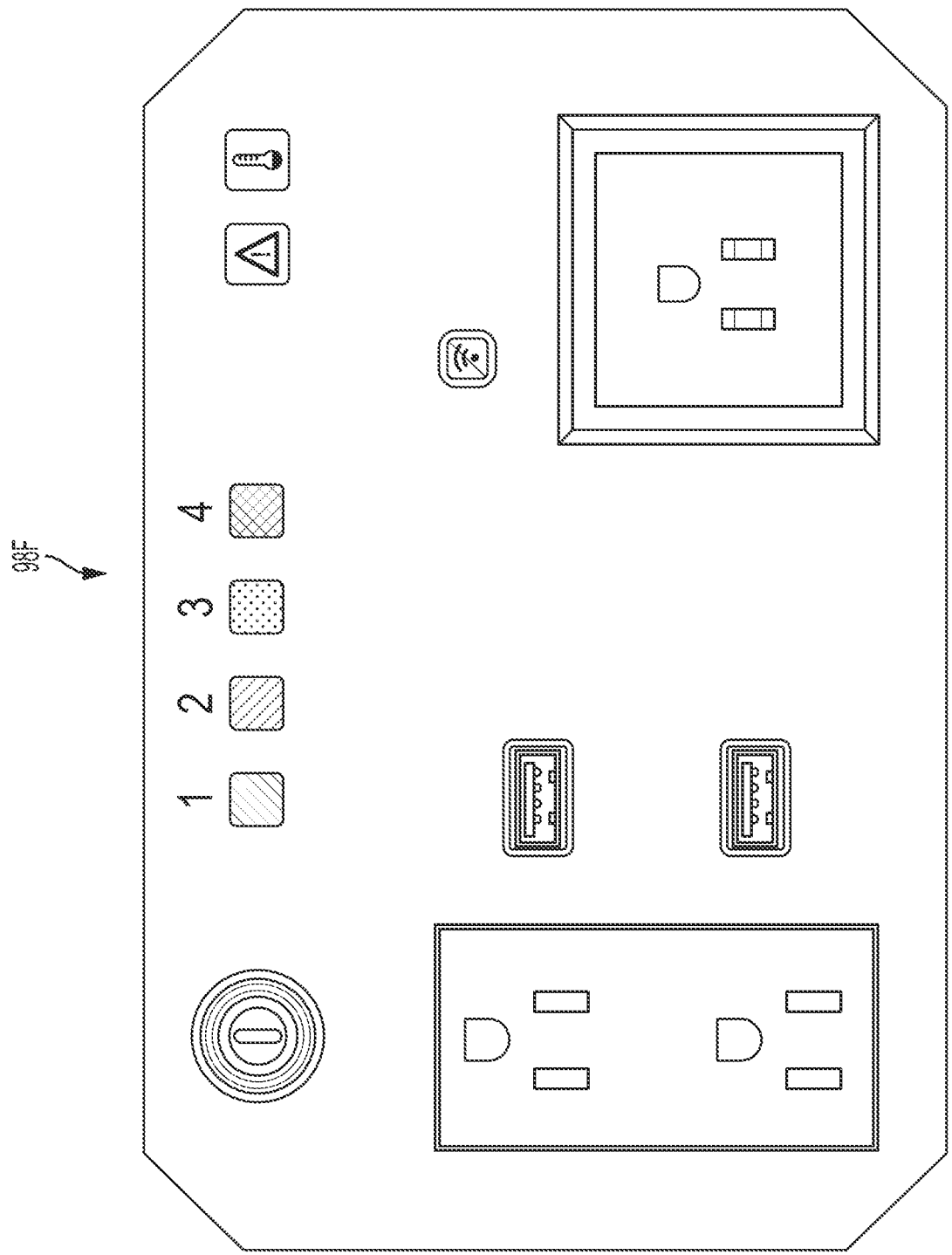

FIG. 3B illustrates a fuel gauge 98B displaying an additional level of information (e.g., identifying which battery pack 14 is being displayed). FIG. 3C illustrates a fuel gauge 98C displaying a location of the battery pack 14 corresponding to the location on the portable power source 10. FIG. 3D illustrates a fuel gauge 98D displaying battery life as an estimate of remaining charge of the battery pack 14. FIG. 3E illustrates a fuel gauge 98E which identifies the lowest charged battery pack 14, and the user can check the battery level on the fuel gauge of that battery pack 14. FIG. 3F illustrates a fuel gauge 98F which identifies the lowest-charged battery pack 14 with a ranking of the battery packs.

Figure 4A:
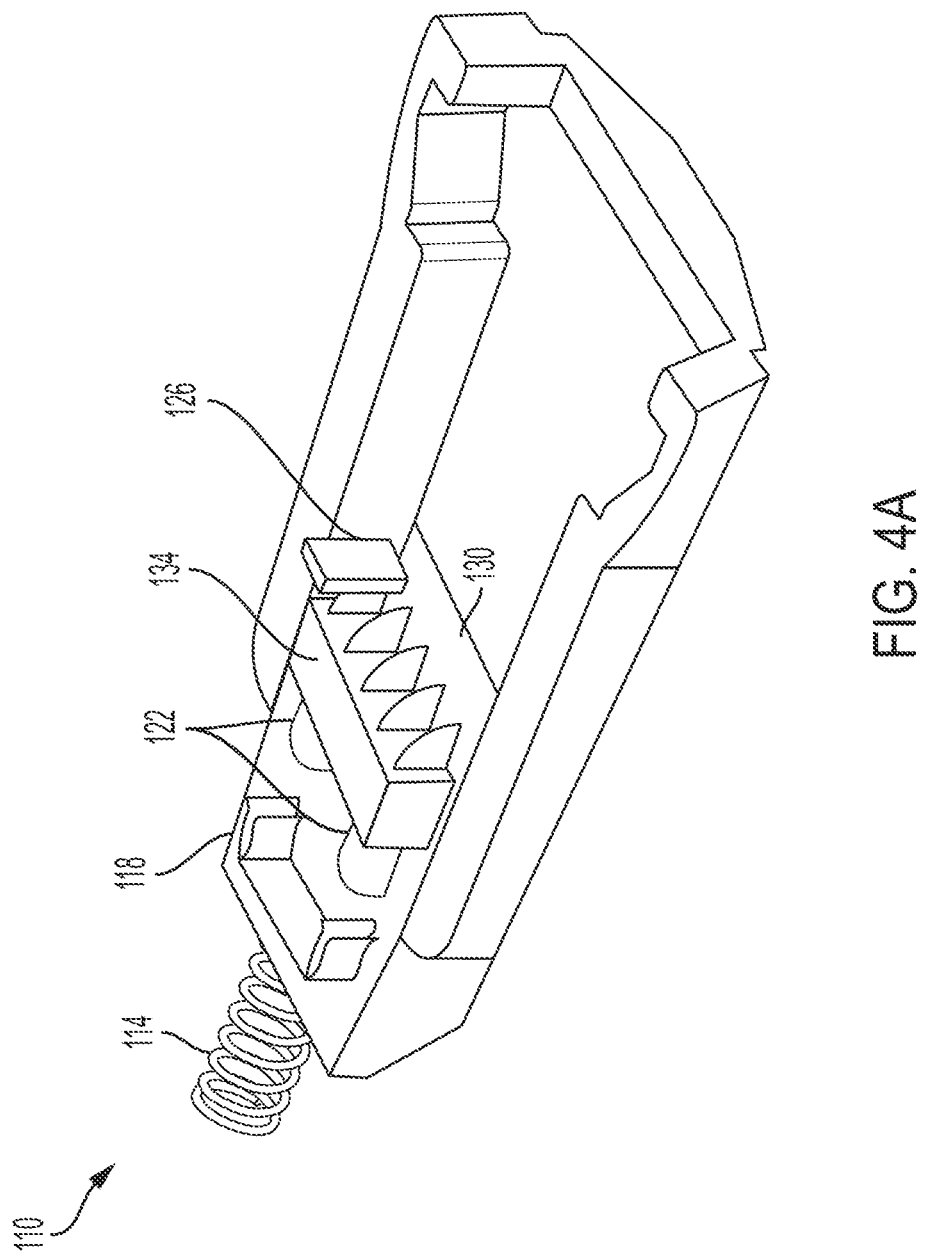
FIGS. 4A and 4B illustrate a spring-loaded interface for battery pack connection, according to embodiments described herein.

With reference to FIG. 4A, one or more of the battery pack supports 46 may include a spring-loaded interface 110 for connection of a battery pack 14. In some constructions, all of the battery pack supports 46 include spring-loaded interfaces 110. In other constructions, fewer than all of the battery pack supports 46 (e.g., three of the battery pack supports 46) include a spring-loaded interface 110. The spring-loaded interface 110 includes a spring 114, contact block 118, contacts 122, a contact sliding lever 126, and terminals 130 for connection to a battery pack 14. The terminals 130 are electrically connectable to the terminals 15 of the battery pack 14. The terminals 130 include power terminals 134 (e.g., positive and negative power terminals 138, 142) for power transfer between the battery pack 14 and the portable power source 10. Communication terminals 146 on the interface 110 facilitate communication (e.g., transmission of signals, information, etc.) between the battery pack 14 and the portable power source 10. Communication may include information such as a temperature, a state-of-charge, an identification, etc., of the battery pack 14.

Figure 4B:
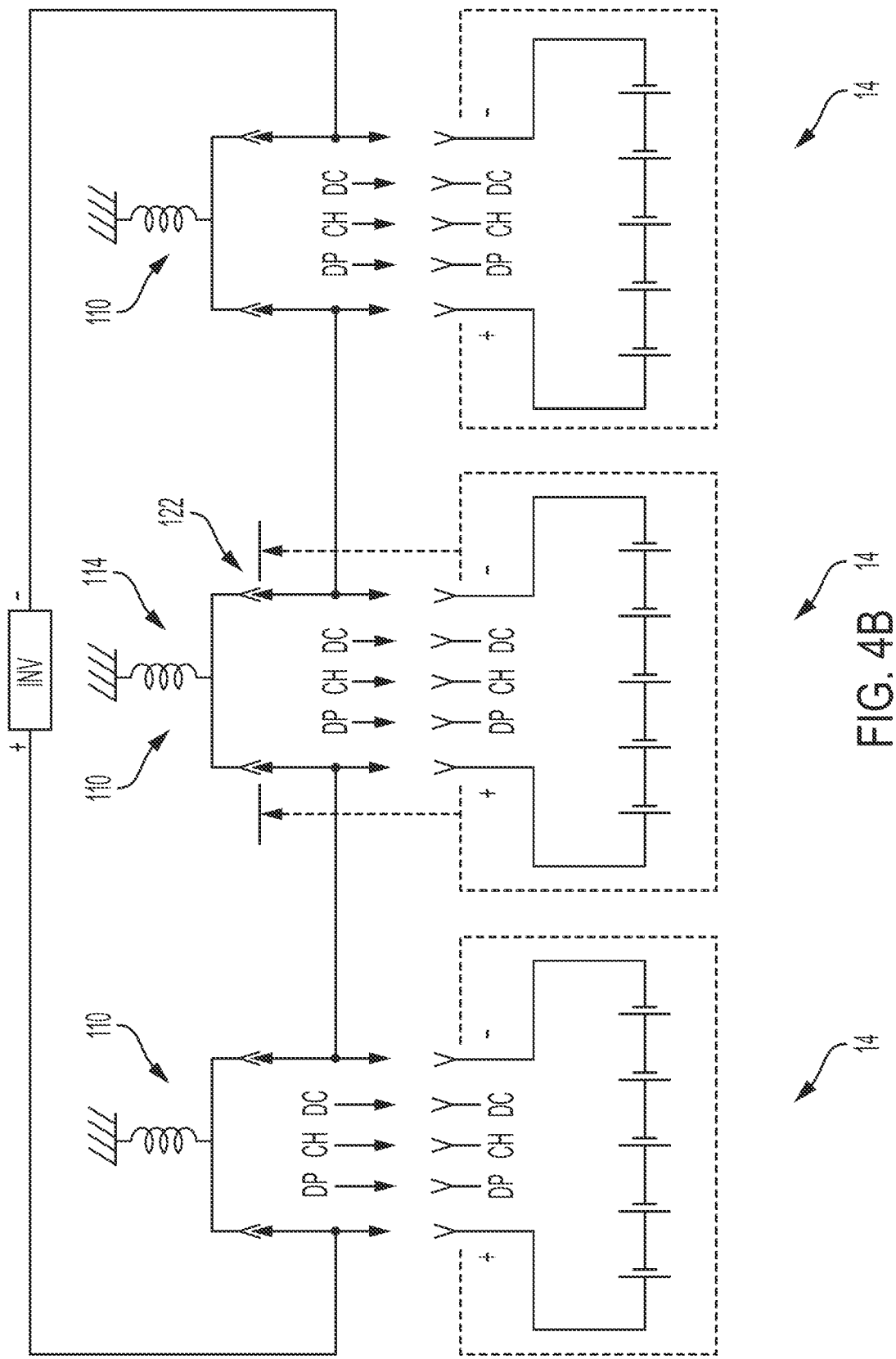

The interface 110 is movable relative to the housing 18 between a retracted, connected position, when a battery pack 14 is connected and an extended, disconnected position, when a battery pack 14 is not connected. In the retracted, connected position, as a battery pack 14 is inserted onto the interface 110, the contact sliding lever 126 is pushed back, and the spring 114 is compressed, causing the contacts 122 to create an electrical connection with the contact block 118 and allowing current to flow between the installed battery pack 14 to the portable power source 10. In the extended, disconnected position, as the battery pack 14 is removed from or is not installed on the interface 110, the electrical connection is severed (see FIG. 4B), stopping or preventing current flow. In the extended, disconnected position, the circuit of the portable power source 10 is also severed, such that no power will be provided from the battery packs 14 to the AC output 78 until the electrical connection is restored.

Figure 5:
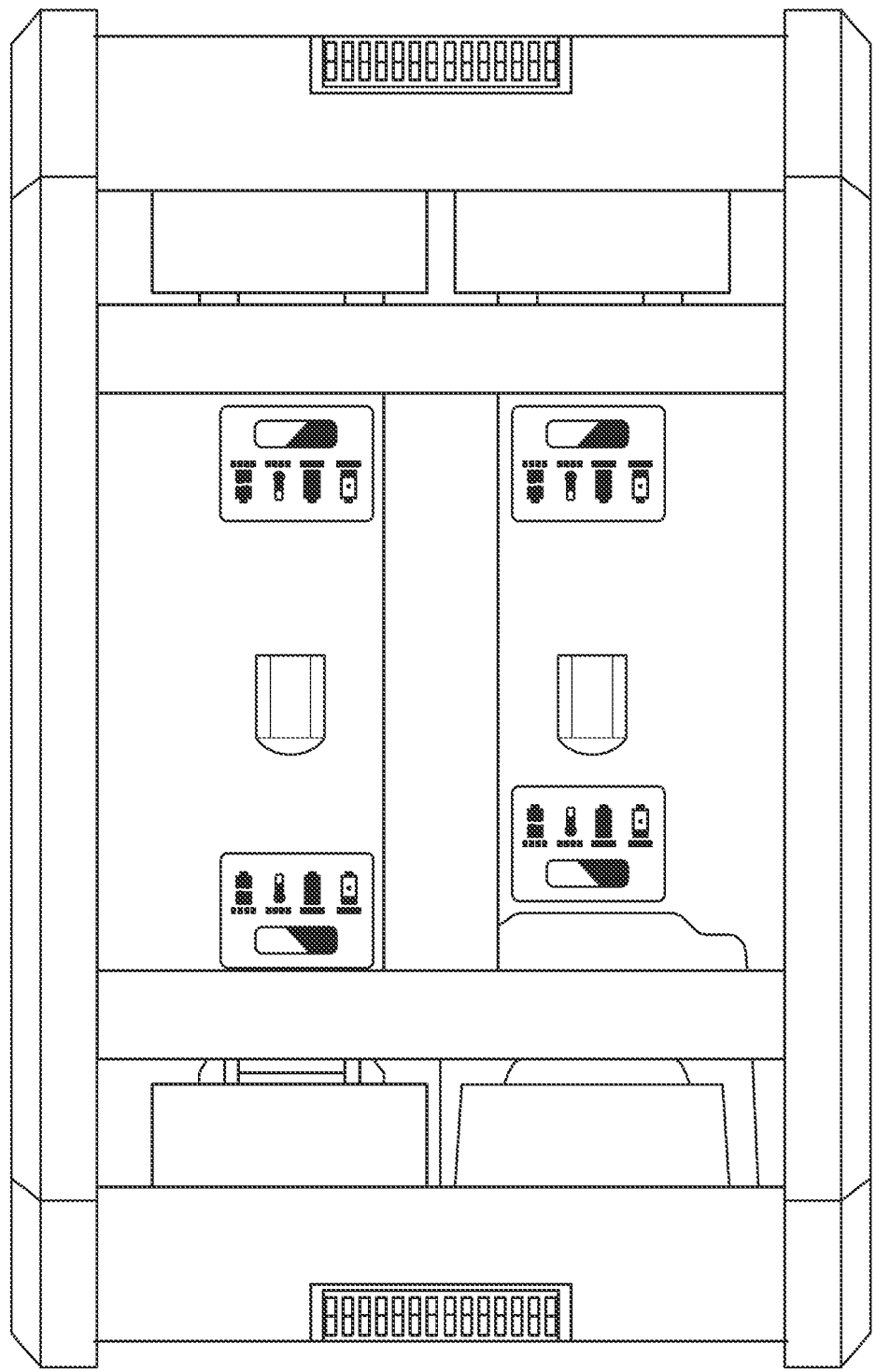
FIG. 5 is a top view of the portable power source in FIG. 1, according to embodiments described herein.

As described above, in some constructions, all battery pack supports 46 include a spring-loaded interface 110. In such constructions, a battery pack 14 is installed on each and every one of the battery pack supports 46 to connect the circuit of the portable power source 10 so that power may be supplied from the battery packs 14 to the AC output 78. In other constructions (see FIGS. 5-6E), the portable power source 10 includes an "optional" battery pack support 46 in which a battery pack 14 is not required to be installed and/or operational for operation of the portable power source 10. In other words, the circuit of the portable power source 10 is connected even without the battery pack 14 supported (or being operational) on the optional battery pack support 46. Installation of a battery pack 14 on the optional battery pack support 14 may complete the circuit of the portable power source 10 through the battery pack 14, rather than through a circuit portion of the optional battery pack support 46. An identification of the optional battery pack support 46 (e.g., "OPTIONAL") identifies the battery pack support 46 to a user.

Figure 6A:
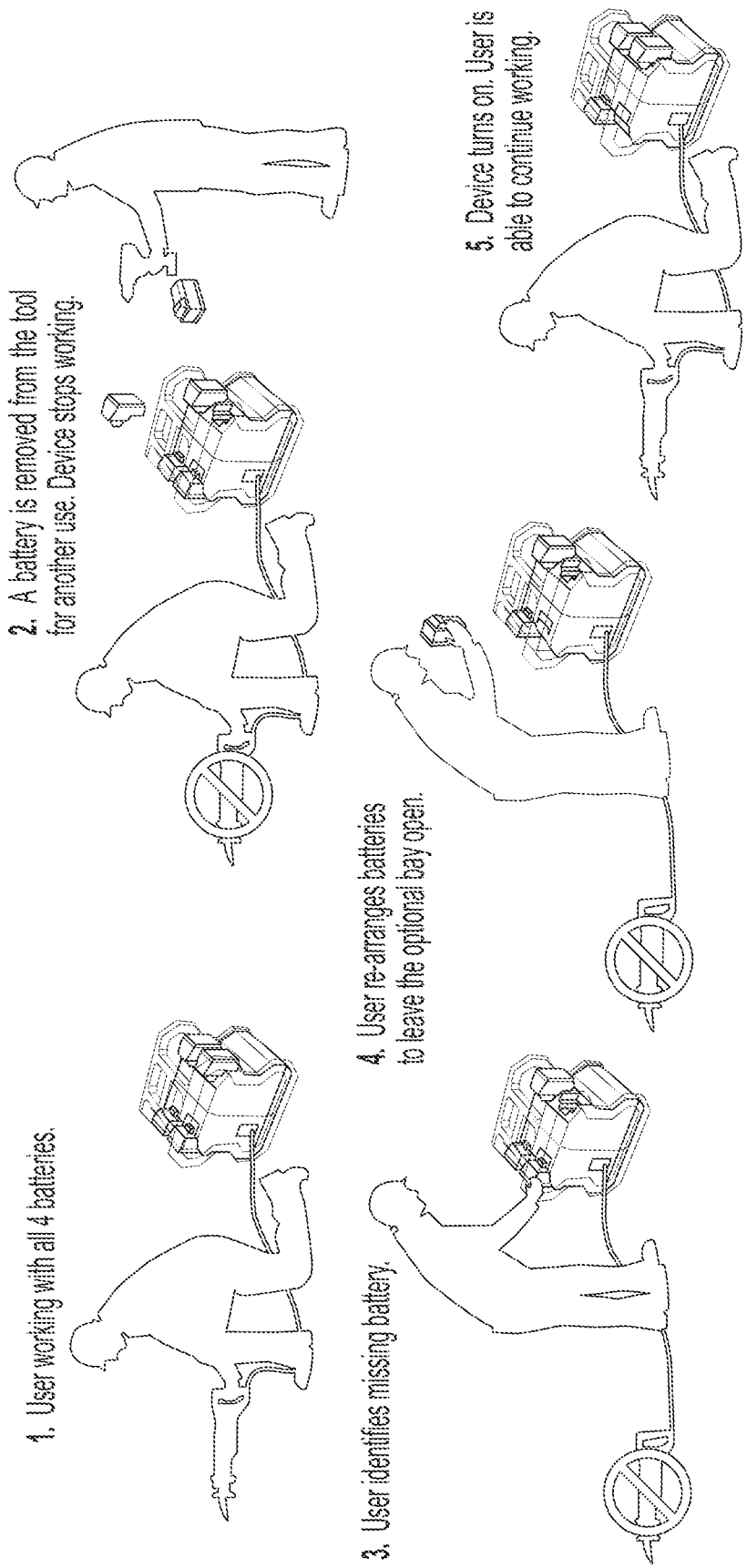
FIGS. 6A, 6B, 6C, 6D, and 6E illustrate operation of the portable power source of FIG. 1, according to embodiments described herein.
Figure 6B:
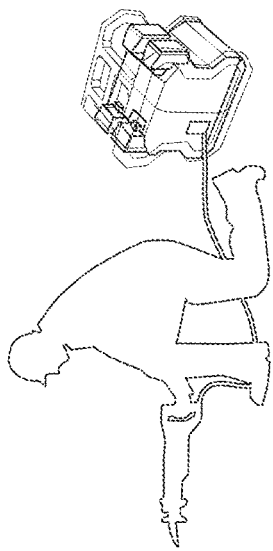
Figure 6B:
Figure 6B:
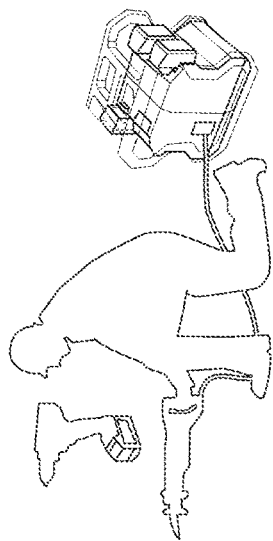
Figure 6C:
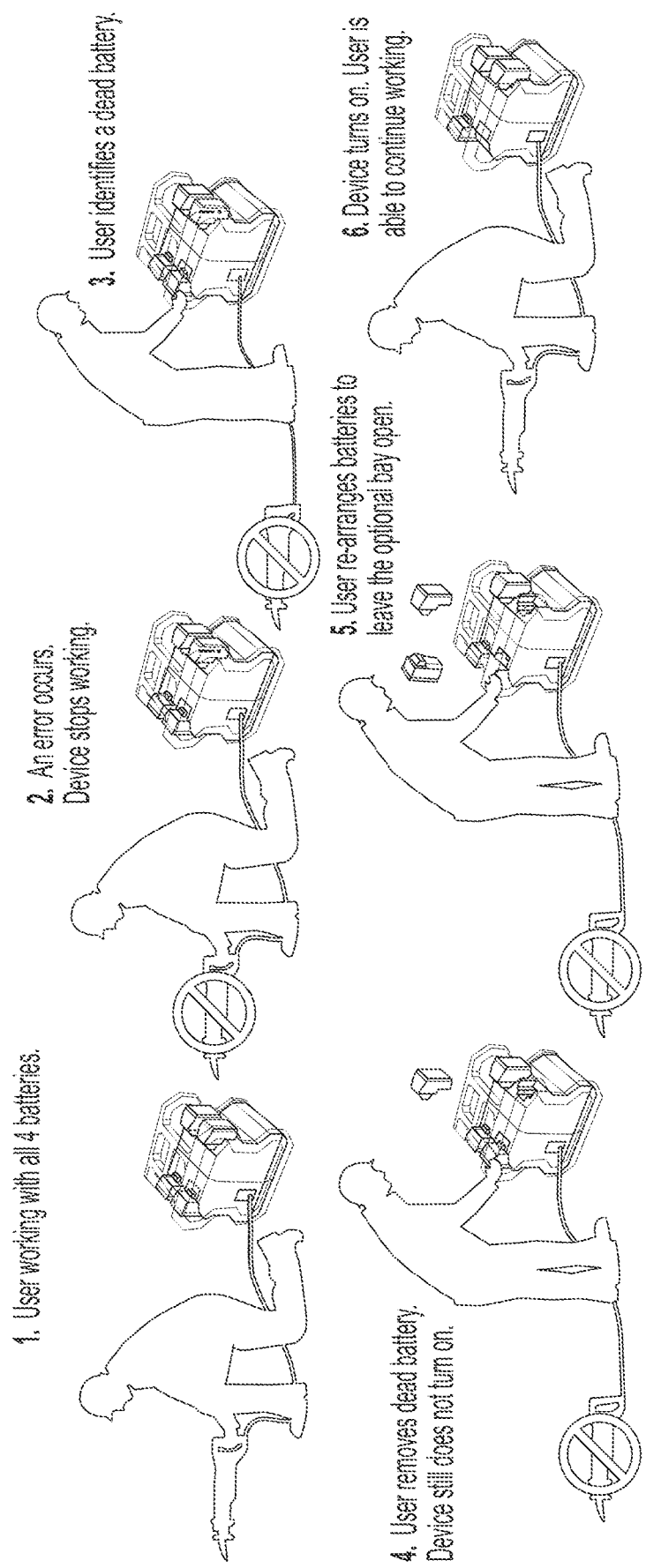
Figure 6D:
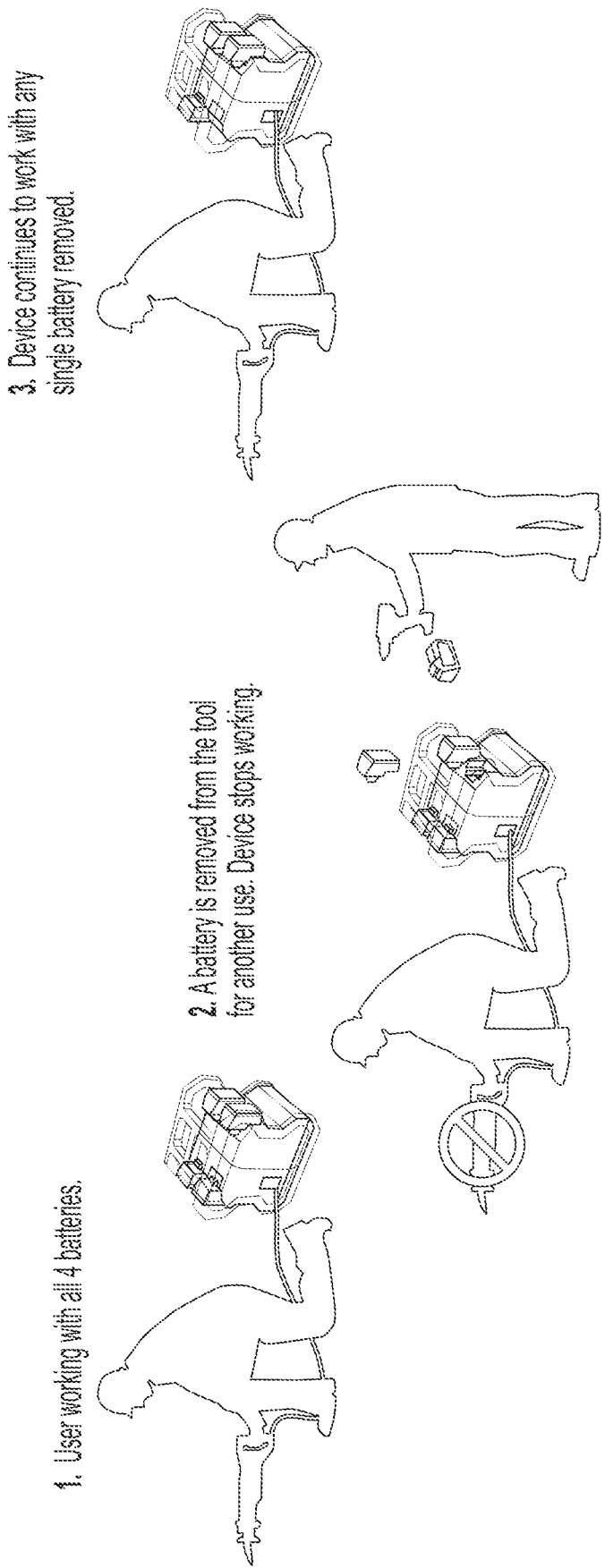
Figure 6E:
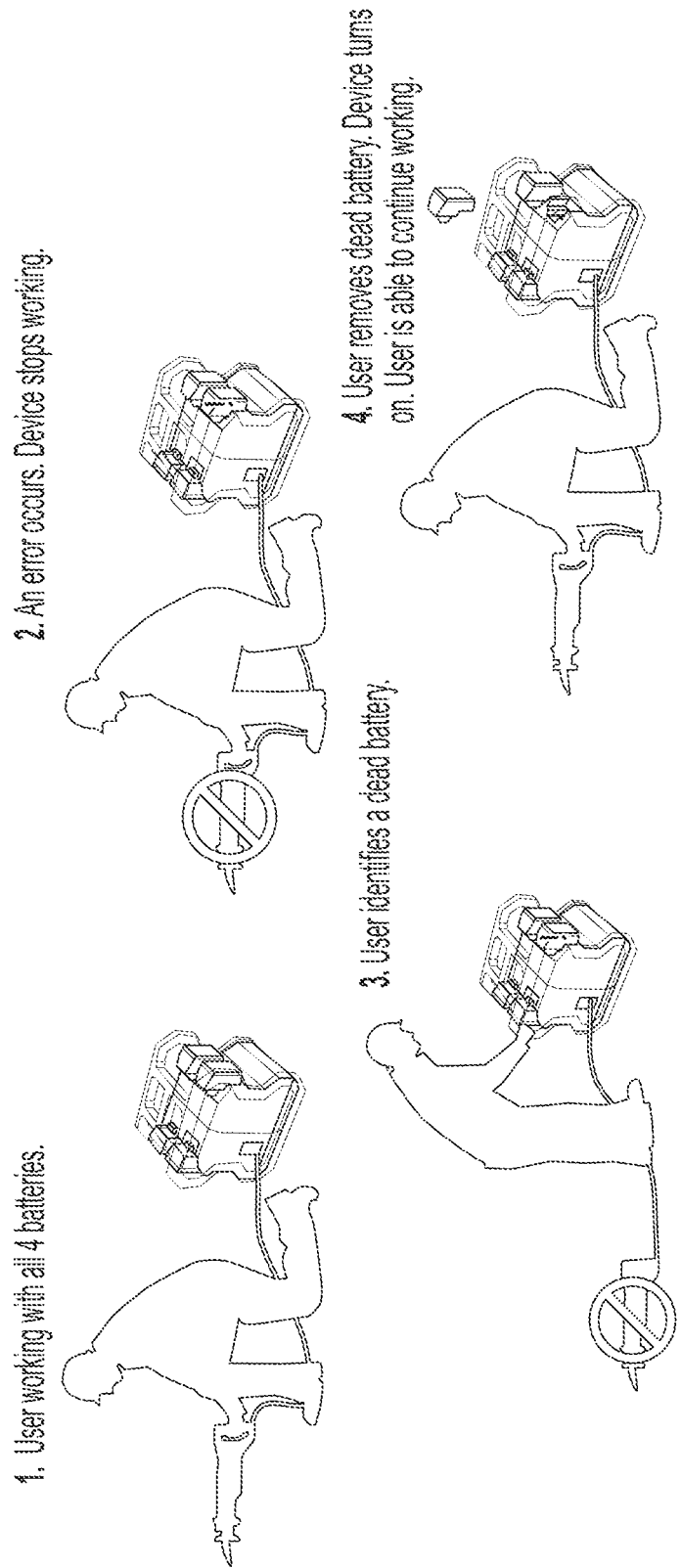

When a battery pack 14 is removed (see FIG. 6A) or is not operational (see FIG. 6C), the portable power source 10 may stop working. When the battery packs 14 are arranged or re-arranged so that the optional battery pack support 46 is open (without a battery pack 14 supported or operational), the portable power source 10 may be operated again. In the construction of FIG. 6B, when a battery pack 14 is removed from the optional battery pack support 46, the portable power source 10 continues to be operational. In other constructions (see FIGS. 6D-6E), the battery pack supports 46 do not include spring-loaded interfaces 110. In the illustrated constructions, the portable power source 10 is operational with any one of the battery packs 14 not installed (FIG. 6D) or not operational (FIG. 6E).

Figure 7:
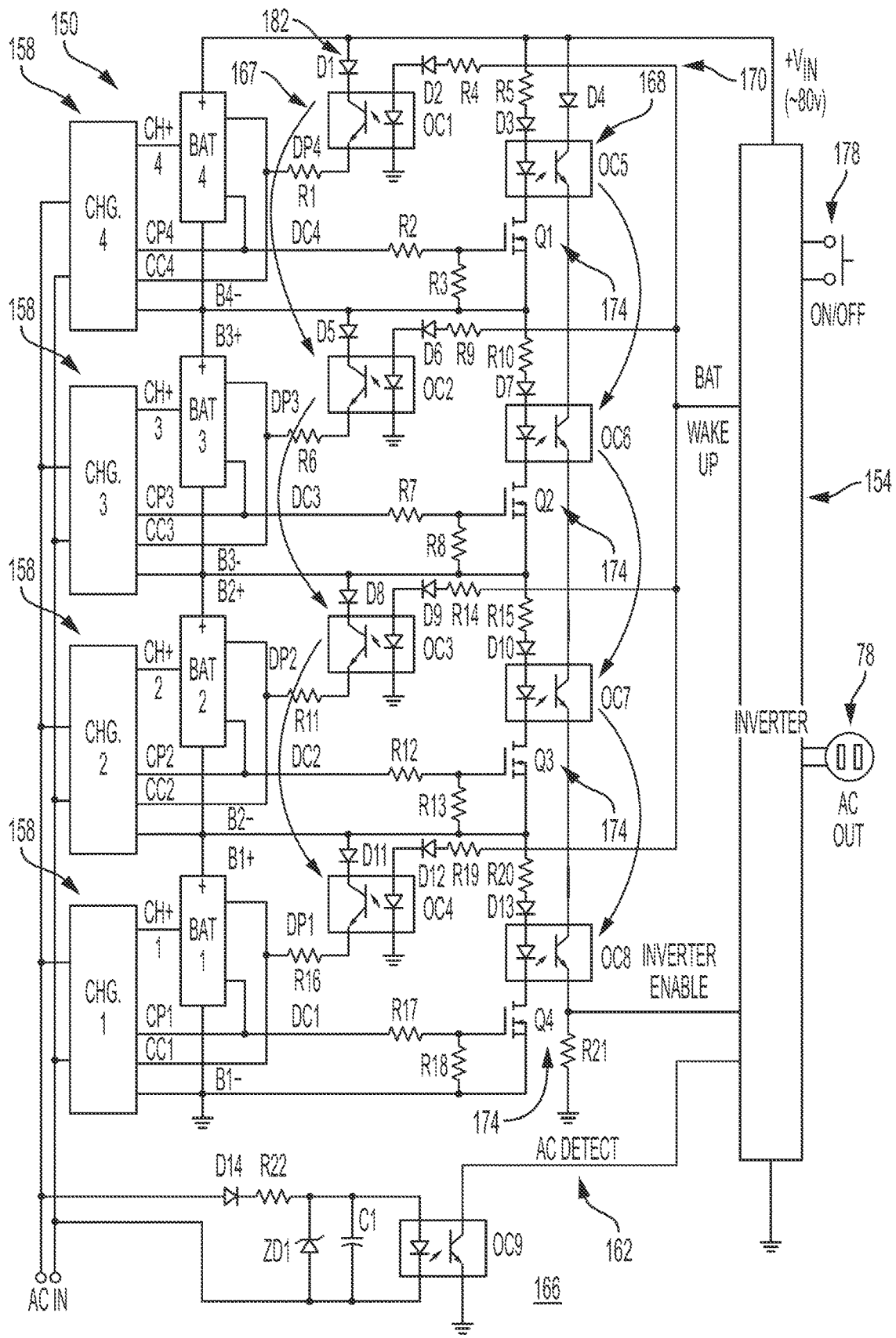
FIG. 7 is a diagram of the circuitry for powering the battery packs and controlling the inverter, according to embodiments described herein.

FIG. 7 illustrates circuitry 150 for the portable power source 10. The illustrated circuitry 150 is operational for charging the battery packs 14A-14D and powering the inverter 154. The illustrated circuitry 150 connects the battery packs 14 in series to supply power (e.g., about 80 V DC input) through the inverter 154 to an external electrical device (e.g., 120 V AC). The circuitry 150 includes separate charging circuit portions 158 for charging the respective series-connected battery packs 14. An AC detect circuit 162 is operable to detect an AC input 94 and includes an optocoupler 166. A battery wake up circuit 170 includes a plurality of switches 174 and optocouplers 167 and 168. The circuitry 150 also includes an inverter power switch 178 and the AC output 78 for providing AC power to external corded electrical devices. A plurality of diodes 182 provide isolation for the battery packs 14 and prevent negative voltages from damaging the optocouplers.

The charging circuit portions 158 provide charging current for the respective battery packs 14 if AC power is provided at the AC input 94. While the battery packs 14 are connected in series to supply power to the inverter 154, each pair of a battery pack 14 and its associated charging circuit portion 158 operate independently of the other pairs. The inputs of the charging circuit portions 158 are electrically connected in parallel with the AC input 94 while the outputs of the charging circuit portions 158 are isolated from the AC input 94.

In the illustrated construction, the inverter 154 includes an electronic processor (not shown) operable to control operation of the inverter 154. The inverter 154 is turned off and does not provide power to the AC outlet 78 when AC power is provided at the AC input 94. The AC detect circuit 162 is monitored until AC power is no longer provided at the AC input 94. If AC power is not provided at the AC input 94, the transistor of the optocoupler 166 is turned on, and the inverter 154 monitors $V_{in}$ and the inverter power switch 178. If the inverter power switch 178 is off, then the inverter 154 remains in a power sleep state. If the inverter power switch 178 is on, the inverter 154 monitors $V_{in}$ (the voltage provided by the battery packs 14) for a voltage above a certain level (e.g., at least about 62 V). If $V_{in}$ (the voltage provided by the battery packs 14) is at or above the level (e.g., at or above 62 volts), the inverter 154 transmits a battery wake up signal and monitors the inverter enable node.

The battery wake up signal includes a voltage pulse transmitted to the LED portion of the optocouplers 167 simultaneously, causing the transistors of the optocouplers 167 to turn on and applying respective voltages to the battery packs 14 to wake the battery packs 14. In other configurations, the battery wake up signal is not transmitted simultaneously to the optocouplers 167; instead, each optocoupler 167 is driven independently (e.g., by the inverter controller).

Upon successful wake up of battery packs 14A-14D, switches 174 are turned on, which causes the optocouplers 168 to turn on and drive the inverter enable signal high. In other configurations, each optocoupler 168 outputs an individual signal to be monitored by the inverter controller. Upon receiving the inverter enable signal(s), the inverter 154 is activated to provide 120 V AC power at the AC output 78. If at any point yin falls below a particular level (e.g., 62 V), the inverter power switch 178 turns off, or the AC detect goes low, the inverter 154 returns to a power sleep state.

The DC and DP lines for each battery pack 14 include an optocoupler to isolate the voltages and to act as a switch. In such a construction, current cannot travel to the inverter enable line until all of the optocouplers are powered with sufficient voltage (e.g., 12 V). All of the DC lines are effectively "AND"-gated to provide a single signal to the inverter controller. Likewise, a single signal from the inverter controller is split to each of the battery DP lines for communication back to each battery pack 14.

In the illustrated construction, the DC signal from each battery pack 14 is used to control the inverter controller with respect to low battery voltage. In other constructions (not shown), the portable power source 10 includes monitoring circuitry, components, etc. configured for the inverter controller to monitor (e.g., directly) the voltage of the battery pack(s) 14.

Figure 8:
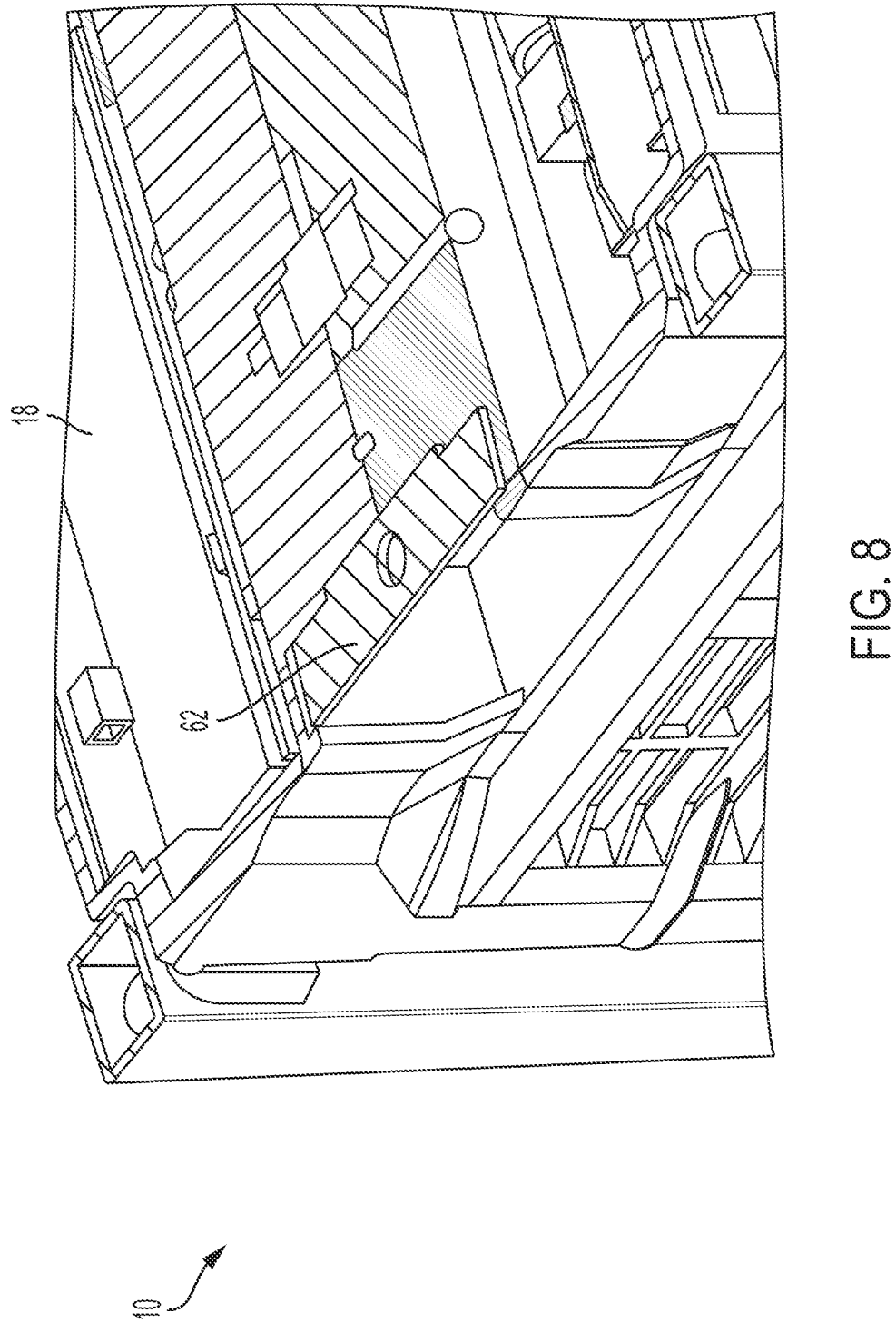
FIG. 8 illustrates a lock interface of the portable power source of FIG. 1, according to embodiments described herein.

With reference to FIG. 8, a battery lock point 62 is provided for a battery pack support 46. A padlock (not shown) may be installed at the battery lock point 62 to prevent the associated battery pack 14 from being detached from the battery pack support 46. When installed, each padlock may extend into and block the removal path of an associated battery pack 14. Additionally or alternatively, the installed padlock may interfere with operation of an associated battery latch mechanism (described below) to prevent removal of the battery pack 14. Additional lock points, for example a padlocked cover (not shown), may be provided on the front 30 of the housing 18 to prevent access to components of the portable power source 10 (e.g., to prevent access to the electrical outlets).

Figure 9A:
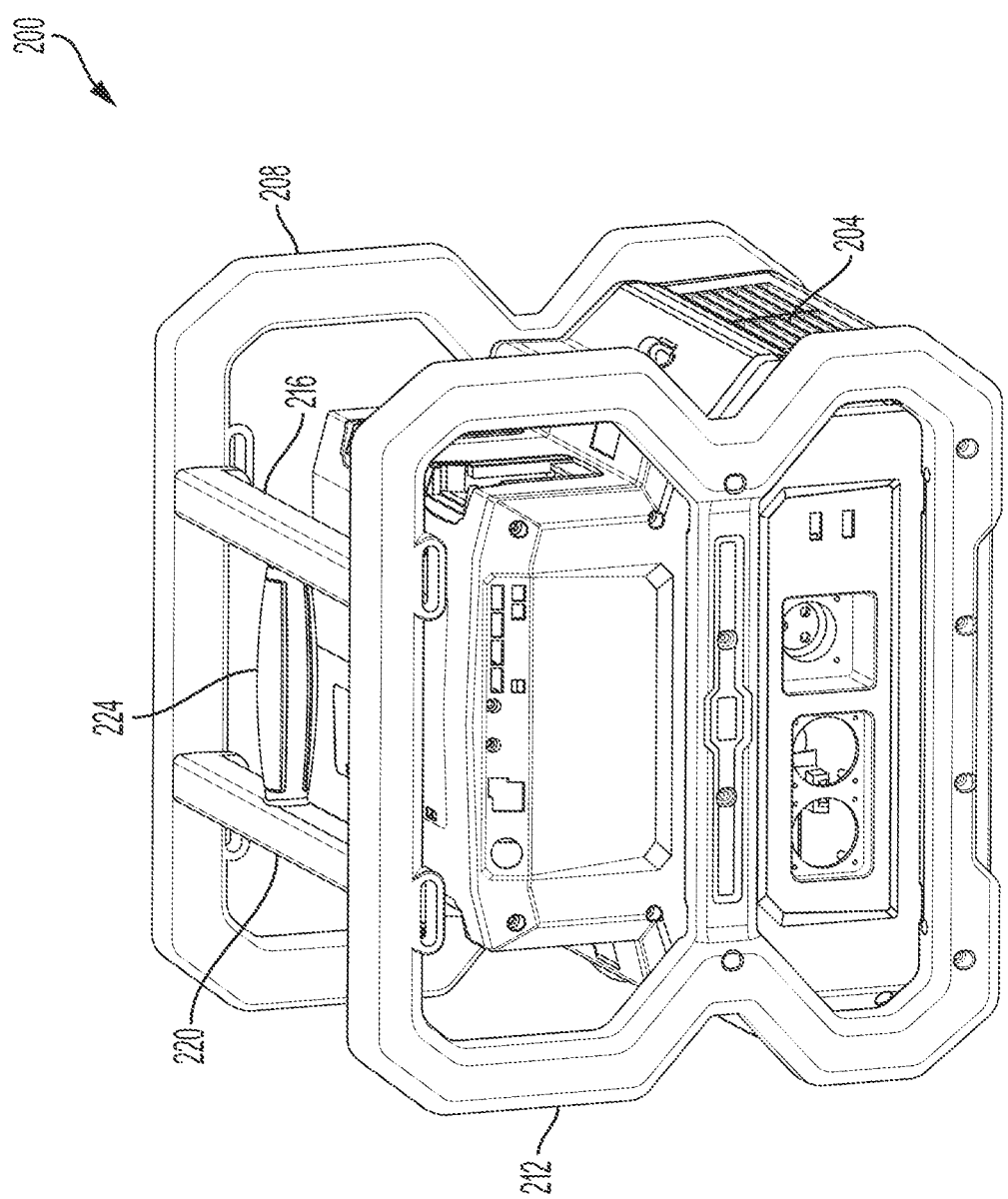
FIG. 9A is a perspective view of a portable power source including a handle in a closed position, according to embodiments described herein.
Figure 9B:
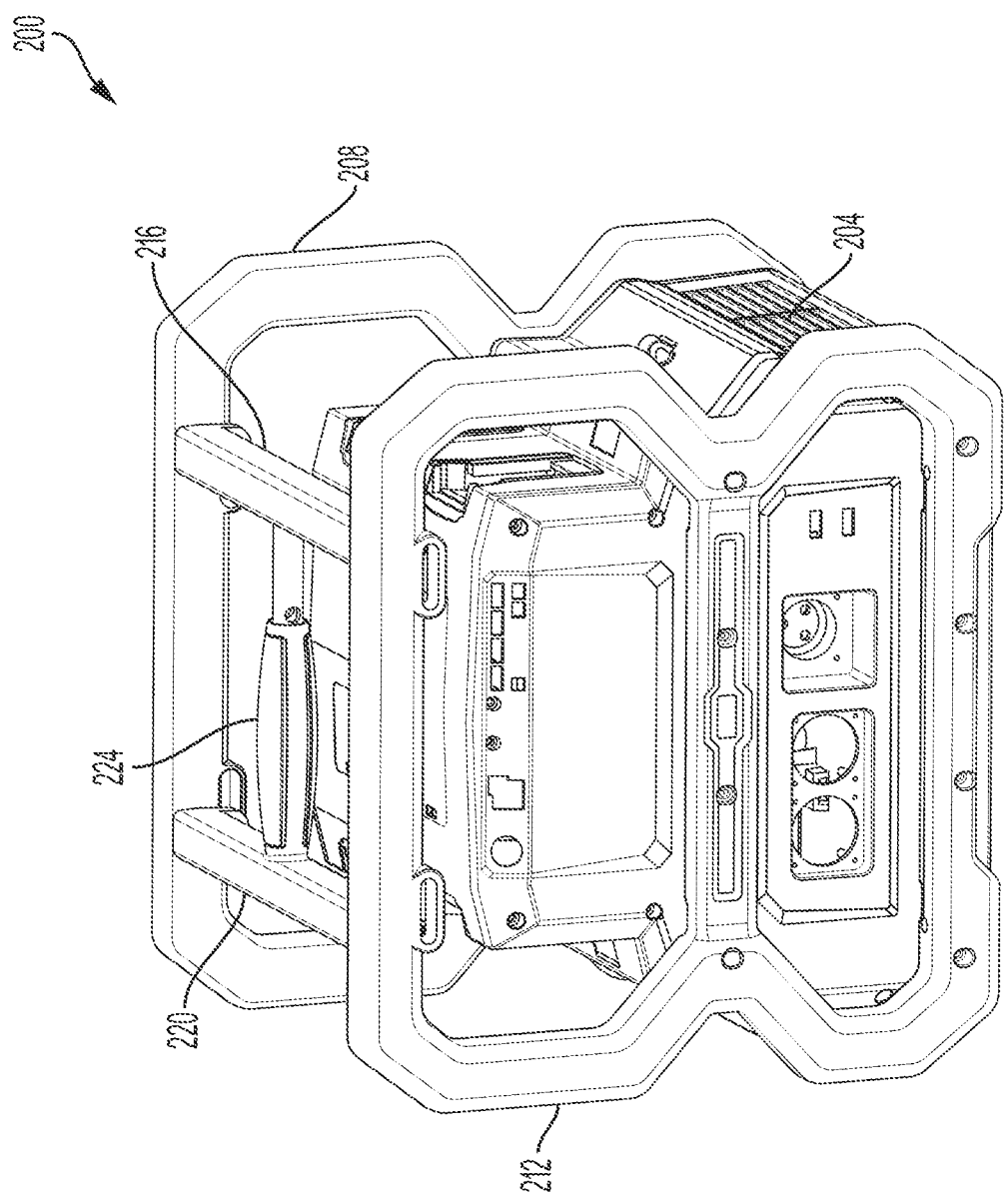
FIG. 9B is a perspective view of a portable power source including a handle in an open position, according to embodiments described herein.

FIGS. 9A-9D illustrate a portable power source 200. The portable power source 200 includes a housing 204, a first frame member 208, a second frame member 212, a first handle support member 216, a second handle support member 220, and a handle 224. The handle 224 extends between and perpendicularly with respect to the first handle support member 216 and the second handle support member 220. FIG. 9A illustrates the handle 224 in a closed position. When the handle 224 is in the closed position, the portable power source 200 is capable of receiving a battery pack in each of a plurality of battery pack supports (see FIG. 1C for a similar portable power source with four battery packs 14A-14D connected to four battery pack supports 46A-46D, respectively). FIG. 9B illustrates the handle 224 in an open position. When the handle 224 is in the open position, the first handle support member 216 and the second handle support member 220 are moved with respect to one another to increase a distance between the first handle support member 216 and the second handle support member 220. In some embodiments, both the first handle support member 216 and the second handle support member 220 are movable. In other embodiments, only one of the first handle support member 216 and the second handle support member 220 is movable.

Figure 9C:
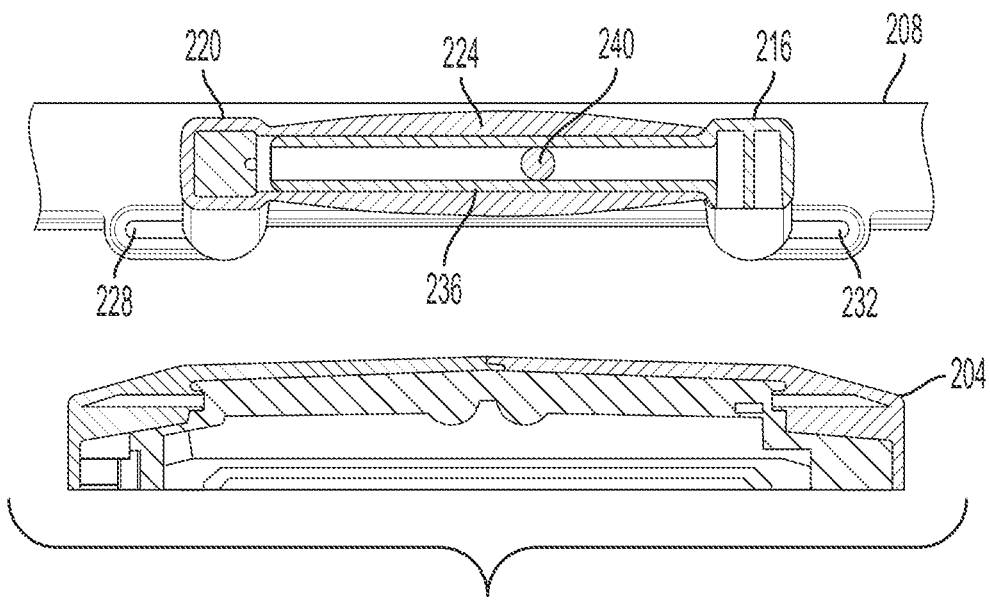
FIG. 9C is a cross-sectional view of the handle of FIG. 9A in the closed position.

Moving the handle 224 between the closed position and the open position causes the first handle support member 216 and the second handle support member 220 to function as lock or retention members for one or more battery packs (e.g., battery packs 14-A-14D). For example, FIG. 9C illustrates a cross-sectional view of the handle 224 in relation to the housing 204 of the portable power source 200. A first aperture 228 and a second aperture 232 function as guides for the movement of the first handle support member 216 and the second handle support member 220. The first aperture 228 and second aperture 232 receive a portion of the second handle support member 220 and the first handle support member 216, respectively, to allow the first handle support member 216 and the second handle support member 220 to move or slide with respect to one another. The first aperture 228 and the second aperture 232 are illustrated in FIG. 9C with respect to the first frame member 208. Corresponding first and second apertures are similarly included on the second frame member 212.

Figure 9D:
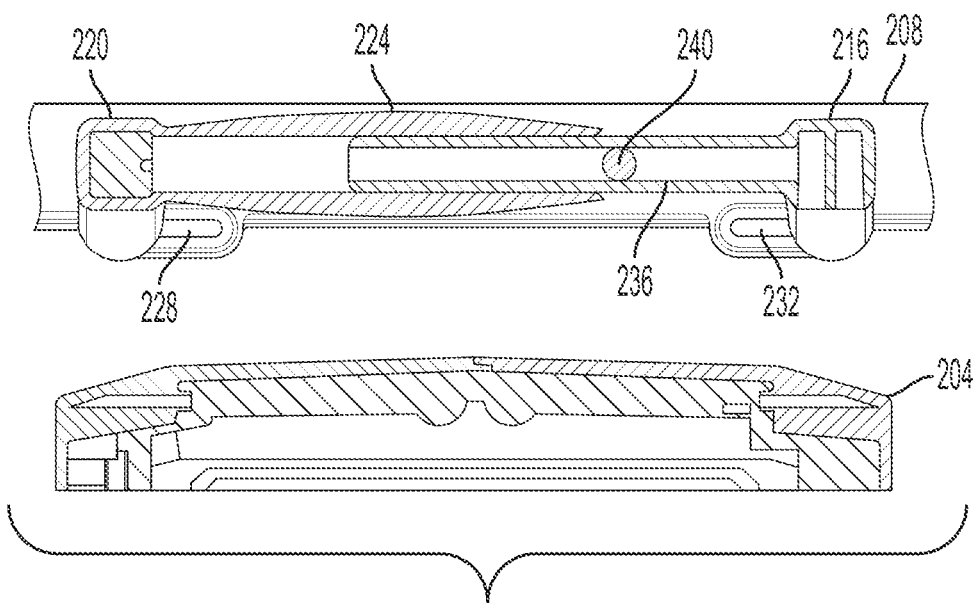
FIG. 9D is a cross-sectional view of the handle of FIG. 9B in the open position.

The handle portion 224 includes in internal rod or member 236 that is enclosed within the handle portion 224 when the handle portion 224 is in the closed position. The member 236 includes an aperture or lock receiving portion 240. As shown in FIG. 9C, when the handle 224 is in the closed position, the first handle support member 216 and second handle support member 220 are at their shortest distance apart, and the distance is shorter in length than the width of the housing 204. As a result, the portable power source 200 is capable of receiving a battery pack in each of a plurality of battery pack supports (see FIG. 1C for a similar portable power source with four battery packs 14A-14D connected to four battery pack supports 46A-46D, respectively). However, as shown in FIG. 9D, when the handle 224 is in the open position, the first handle support member 216 and second handle support member 220 are further apart. The length of the combination of the first handle support member 216, the second handle support member 220, and the handle 224 is longer than when the handle 224 is in the closed position and is approximately the same length as the width of the housing 204. As a result, the portable power source 200 is either incapable of receiving a battery pack in each of a plurality of battery pack supports or any battery packs connected to the battery pack supports are prevented from being removed. As such, the first handle support member 216 and the second handle support member 220 are configured as mechanical interlocks that can be used to physically prevent a battery pack from being connected to or removed from the portable power source 200. A padlock or similar locking mechanism can be inserted into the aperture 240 to hold the handle 224 in the open position.

Figure 10A:
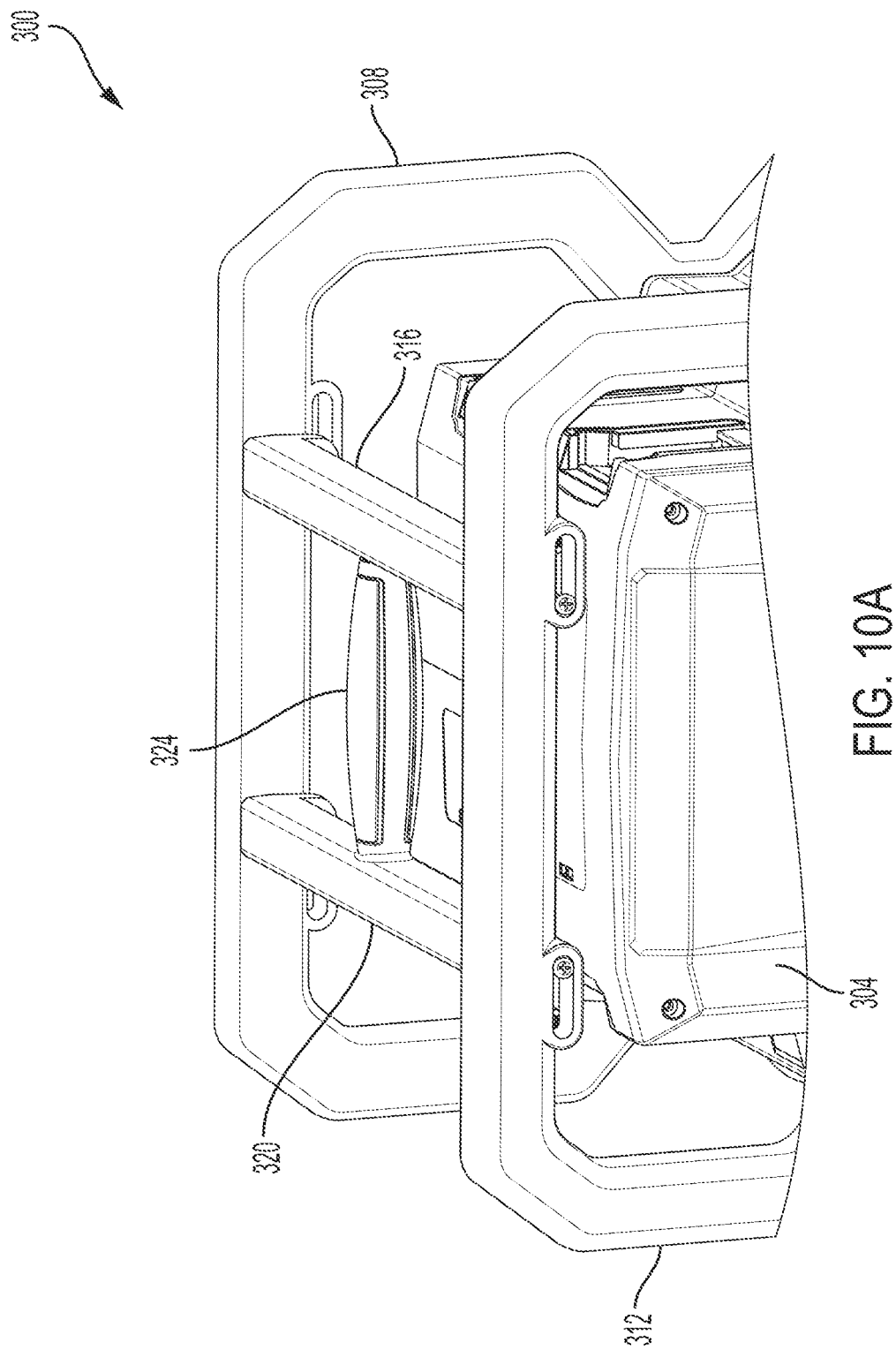
FIG. 10A illustrates a lockable handle for a portable power source, according to embodiments described herein.
Figure 10B:
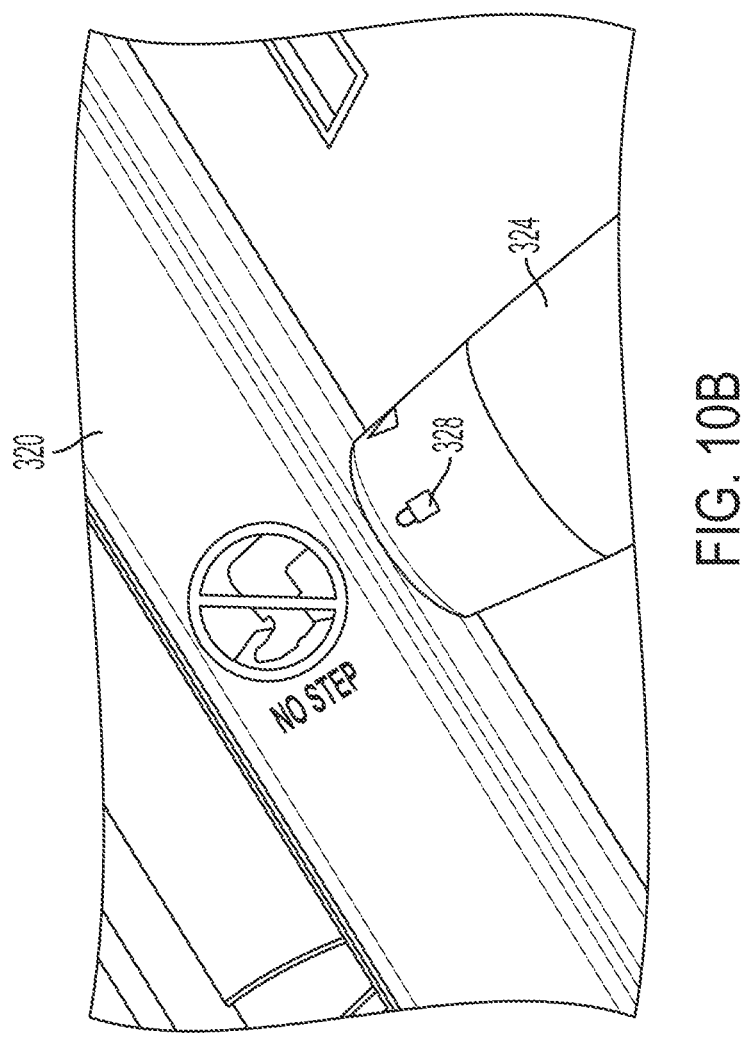
FIG. 10B illustrates the lockable handle of FIG. 10A in a locked position.
Figure 10C:
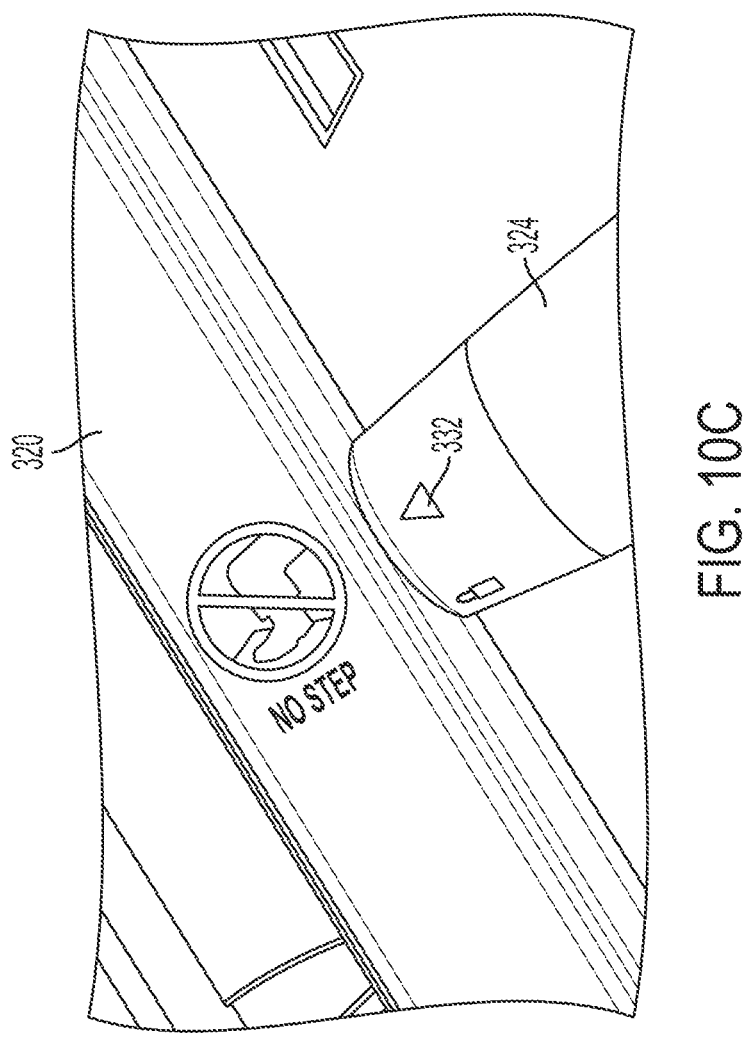
FIG. 10C illustrates the lockable handle of FIG. 10A in an unlocked position.

FIGS. 10A-10F illustrate a portable power source 300. The portable power source 300 includes a housing 304, a first frame member 308, a second frame member 312, a first handle support member 316, a second handle support member 320, and a handle 324. The handle 324 extends between and perpendicularly with respect to the first handle support member 316 and the second handle support member 320. FIG. 10A illustrates the handle 324 in a closed position.

Figure 1C:
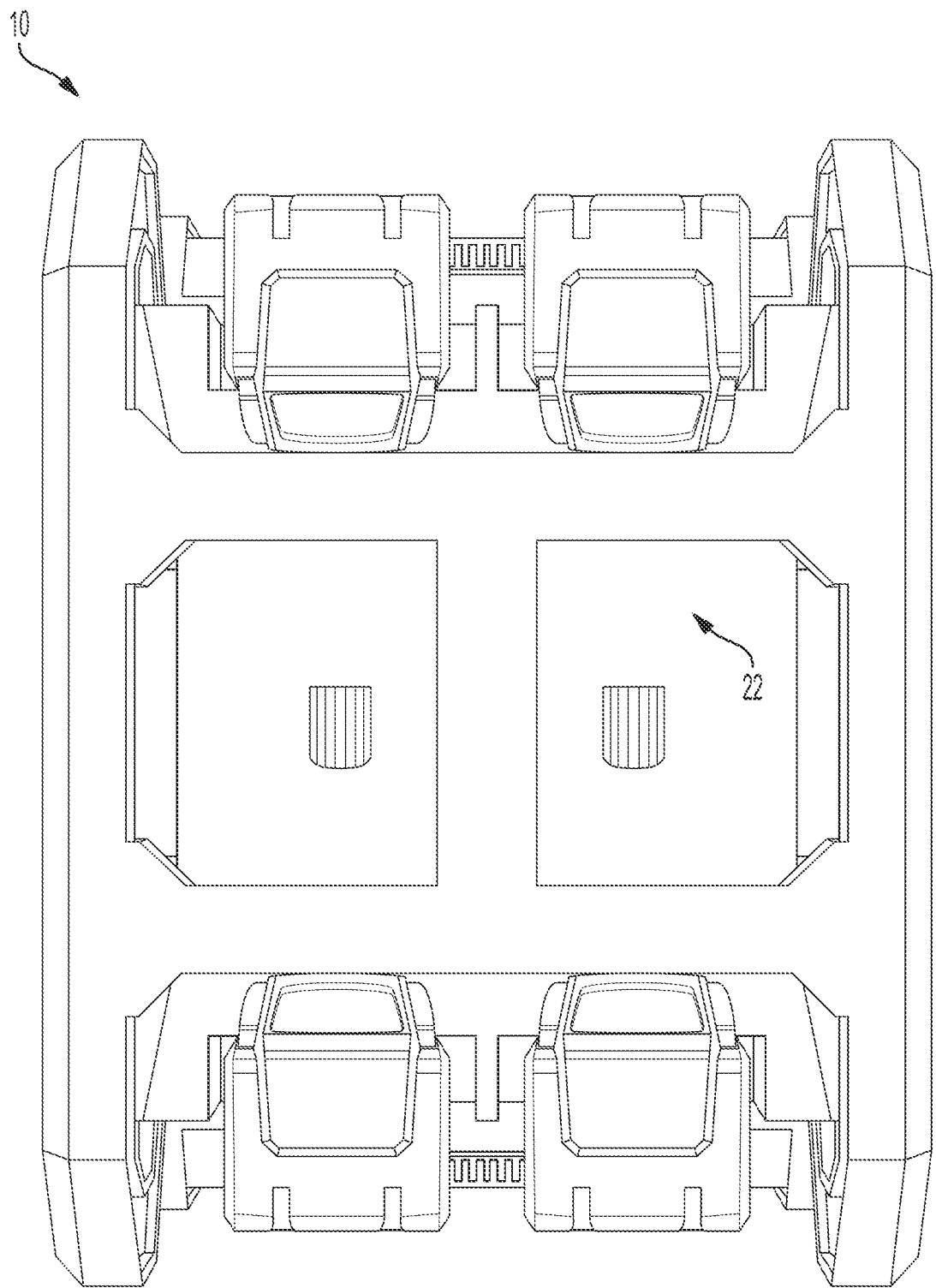
FIG. 1C is a top view of the portable power source of FIG. 1A.
Figure 1D:
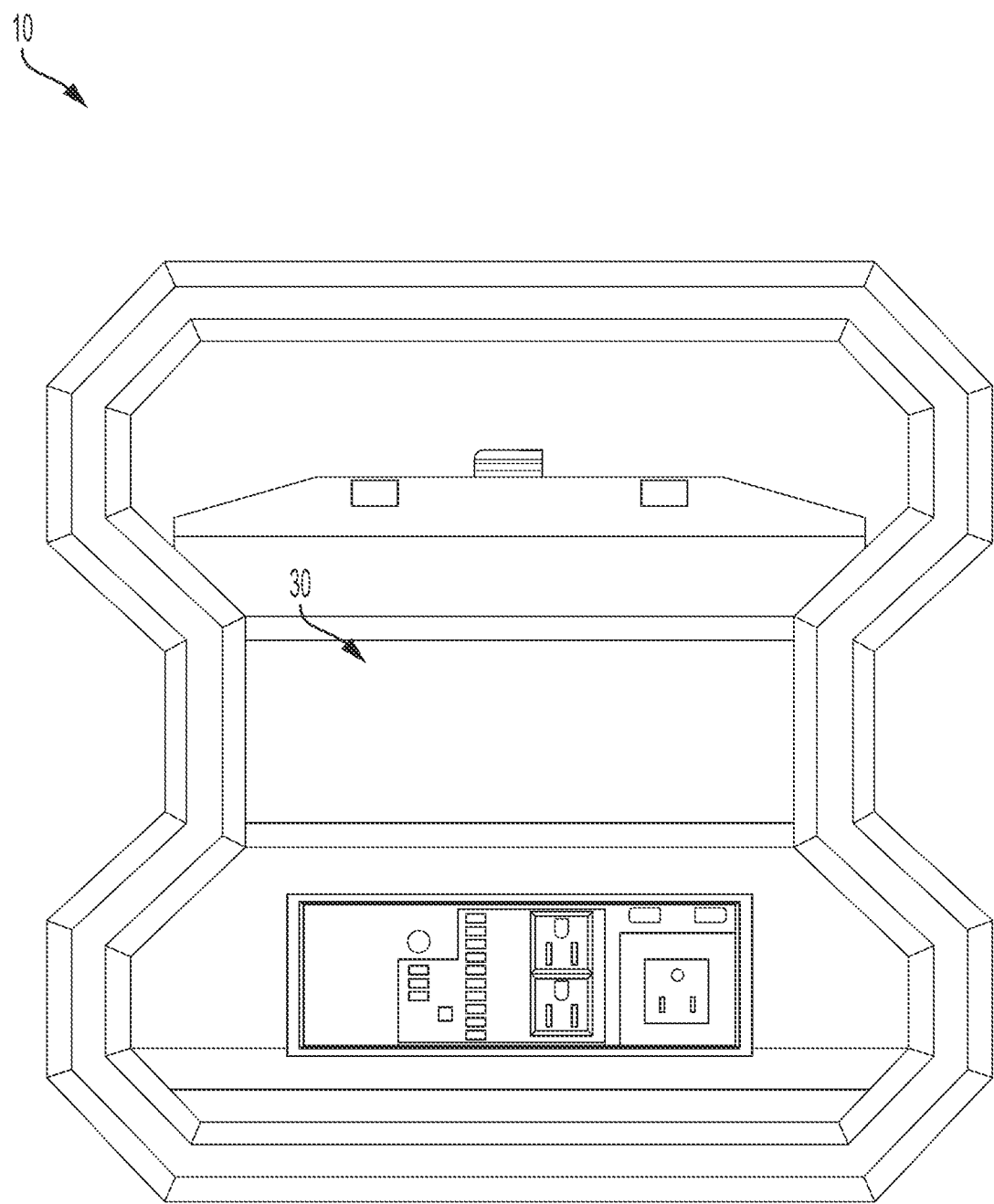
FIG. 1D is a front view of the portable power source of FIG. 1A.
Figure 1E:
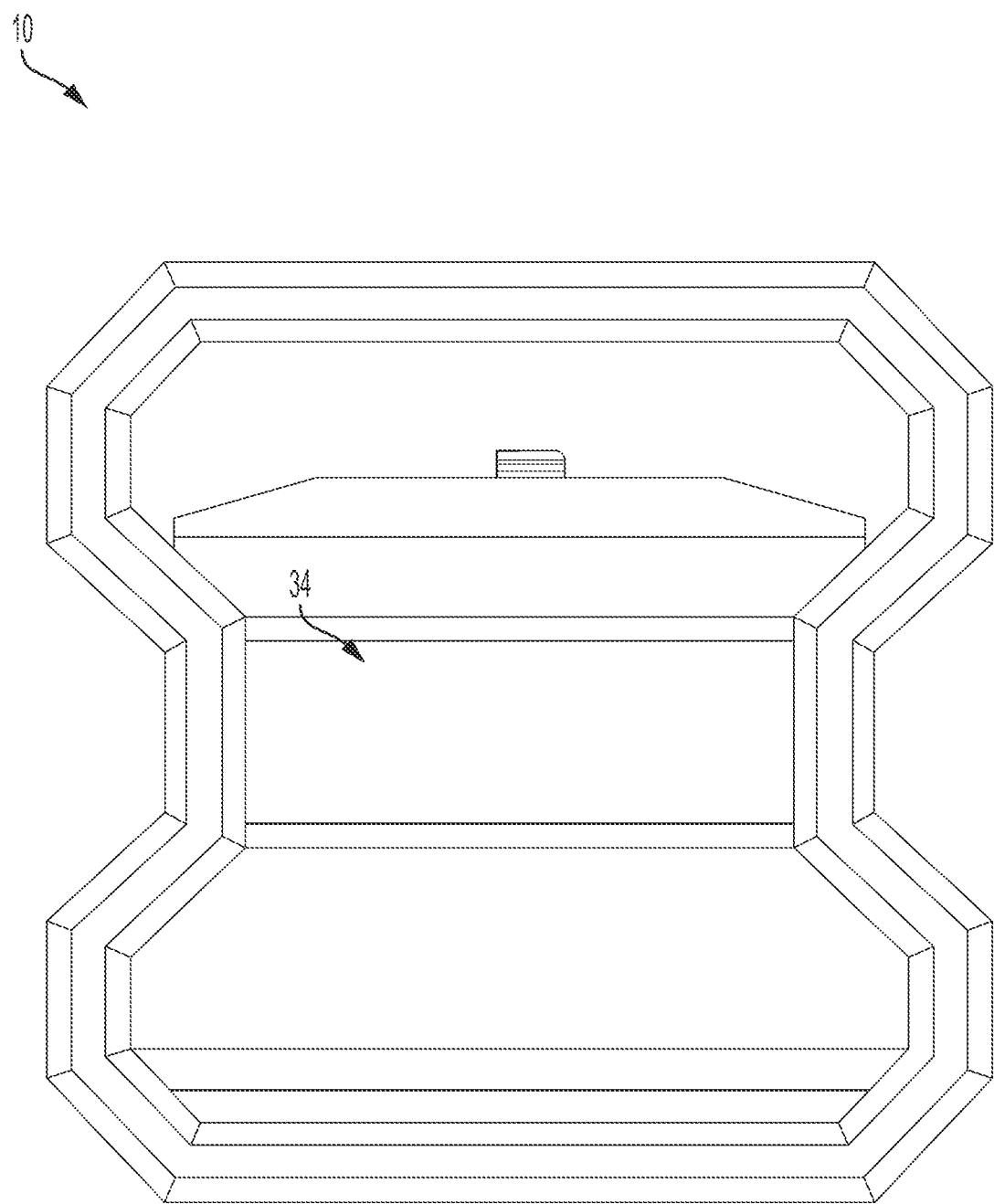
FIG. 1E is a rear view of the portable power source of FIG. 1A.
Figure 1F:
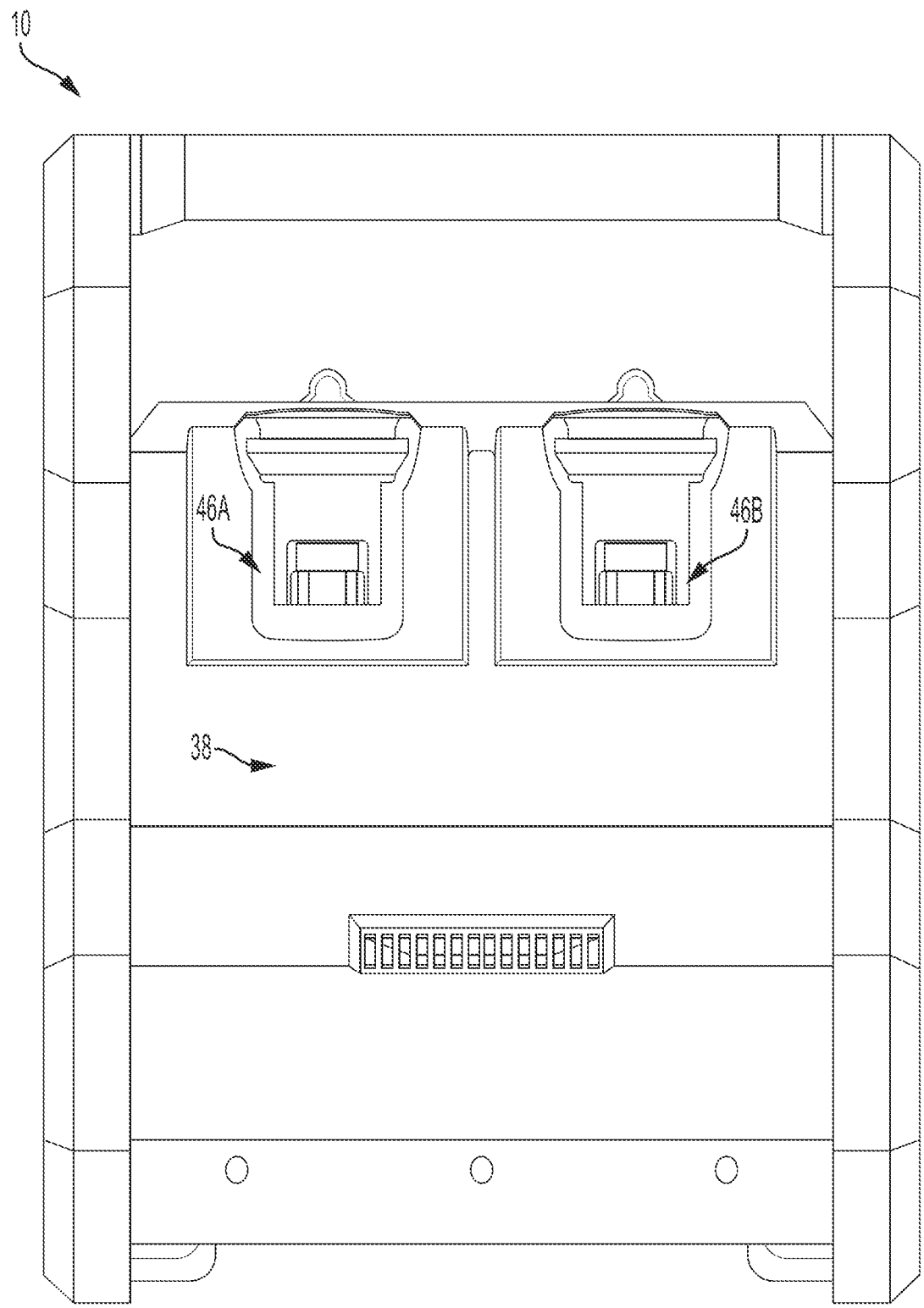
FIG. 1F is a side view of the portable power source of FIG. 1A.
Figure 1G:
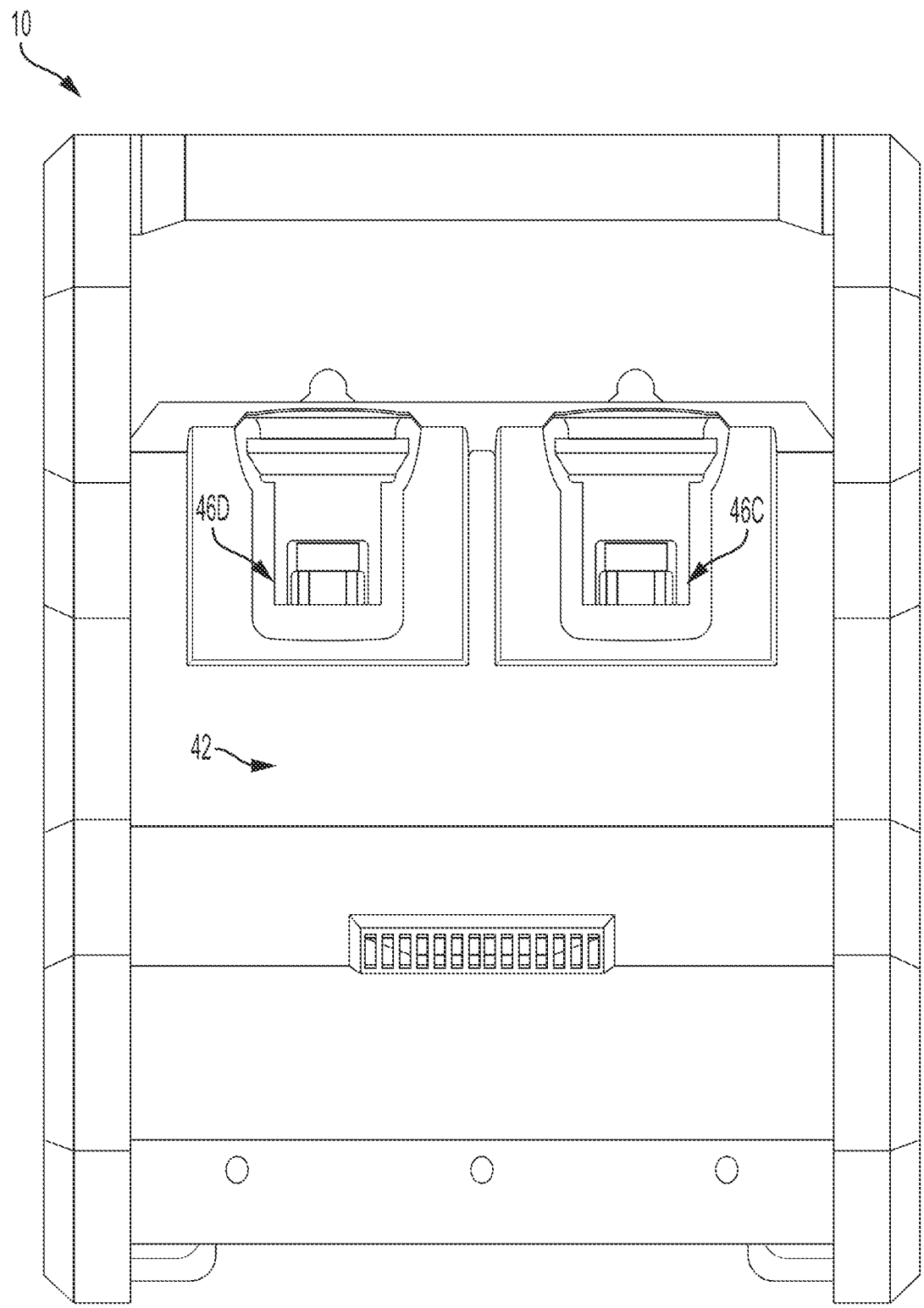
FIG. 1G is another side view of the portable power source of FIG. 1A.
Figure 1H:
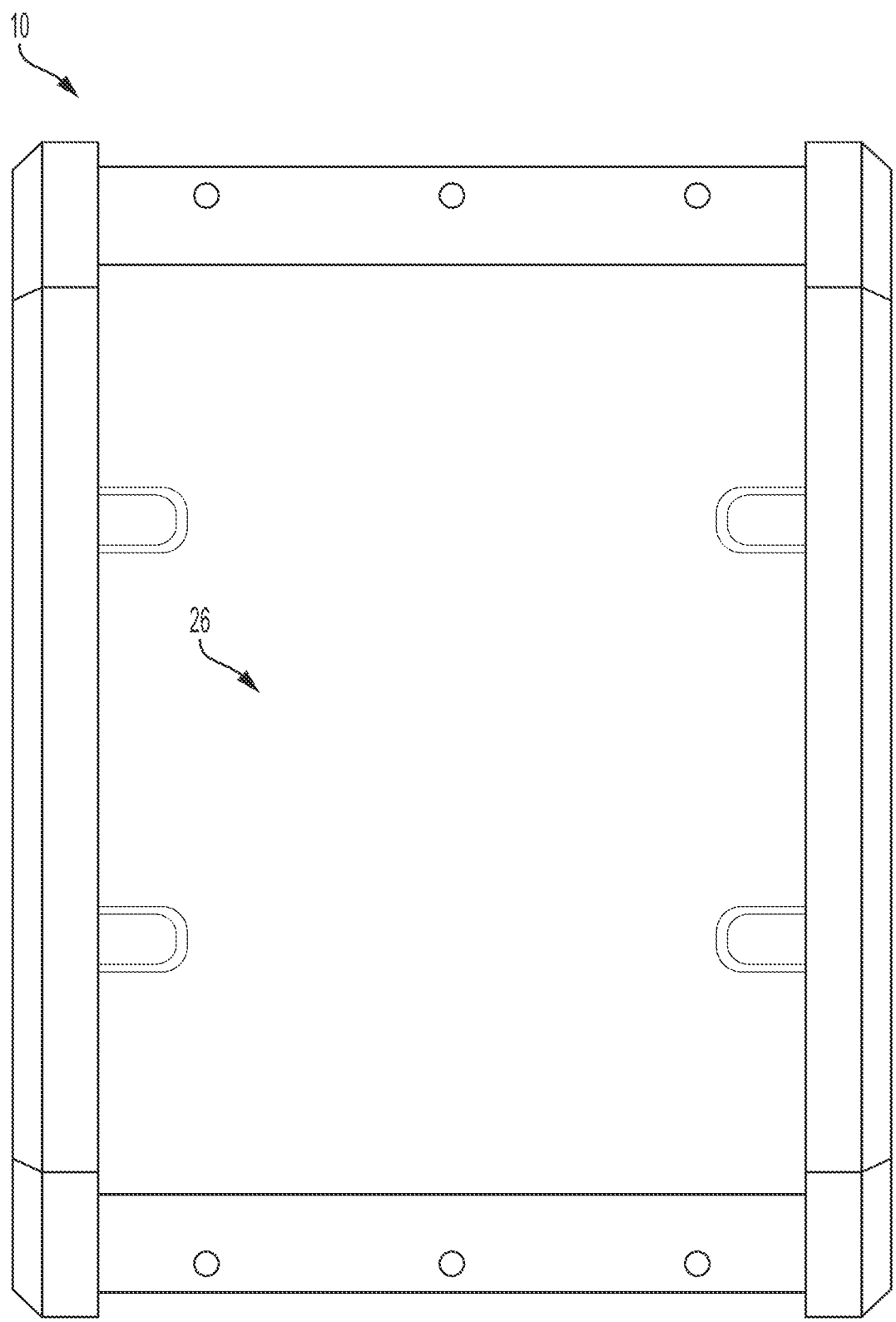
FIG. 1H is a bottom view of the portable power source of FIG. 1A.
Figure 1I:
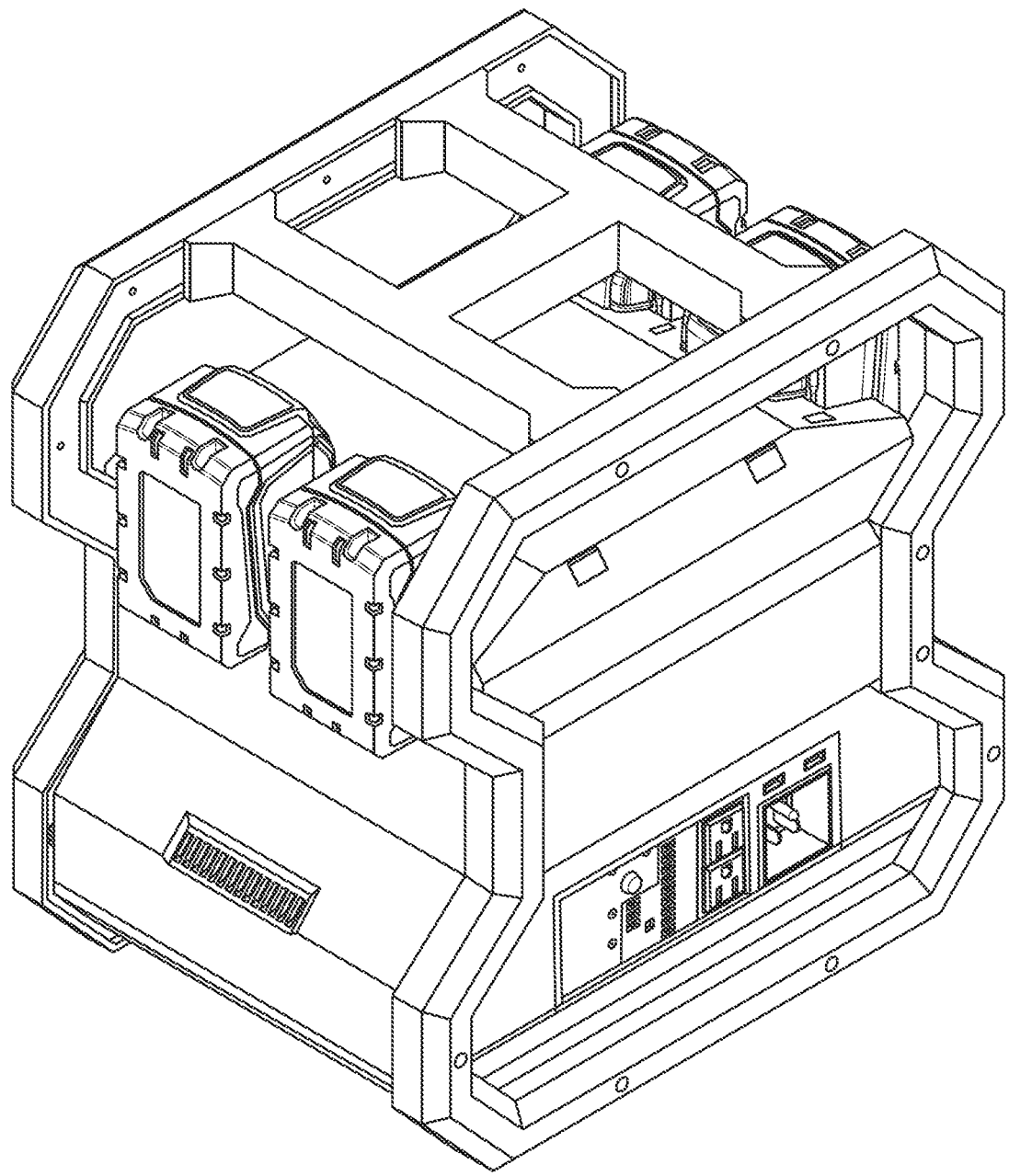
FIG. 1I is a perspective view of the portable power source of FIG. 1A.
Figure 1J:
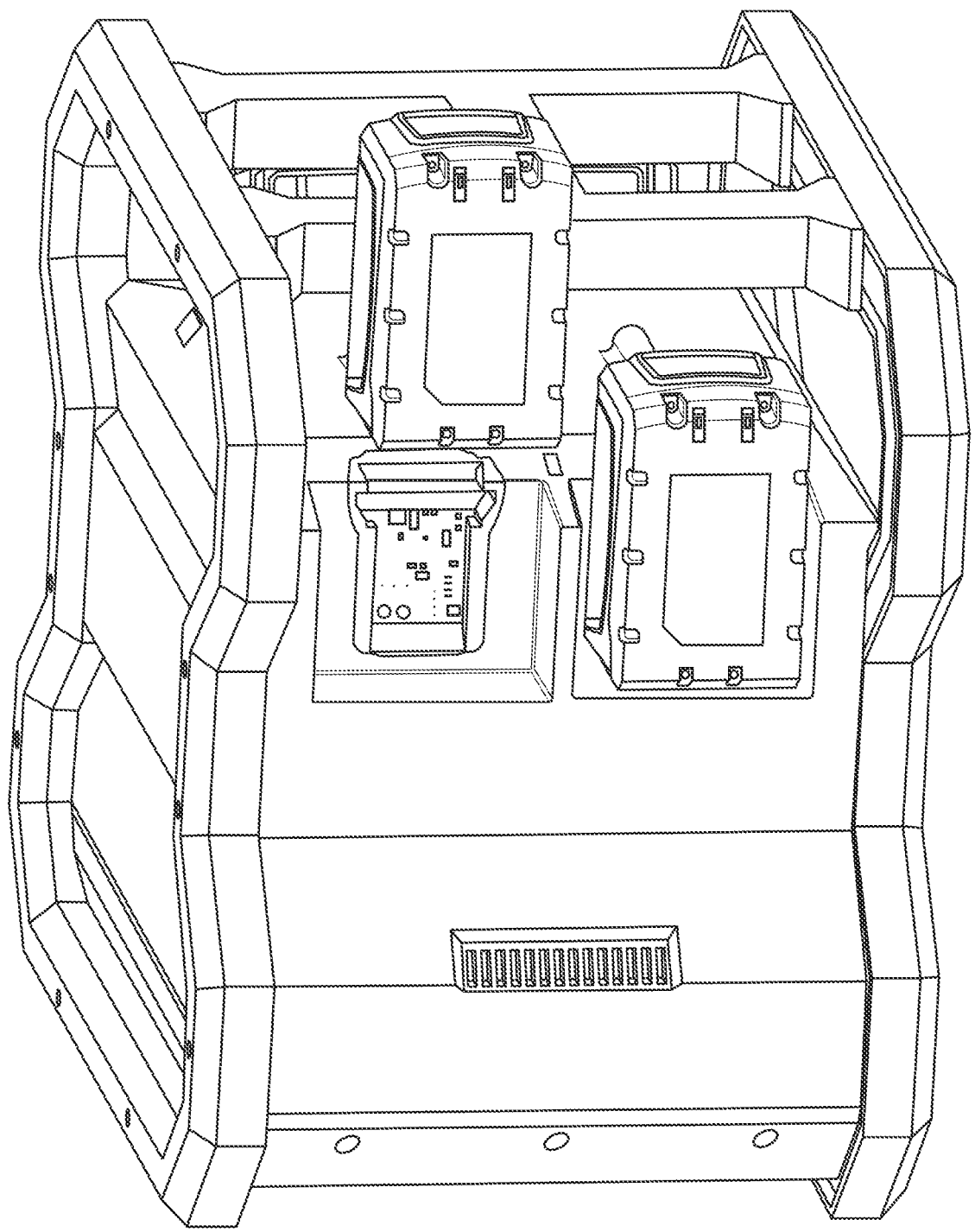
FIG. 1J is a perspective view of the portable power source of FIG. 1A, illustrating removal or insertion of a battery pack.
Figure 1K:
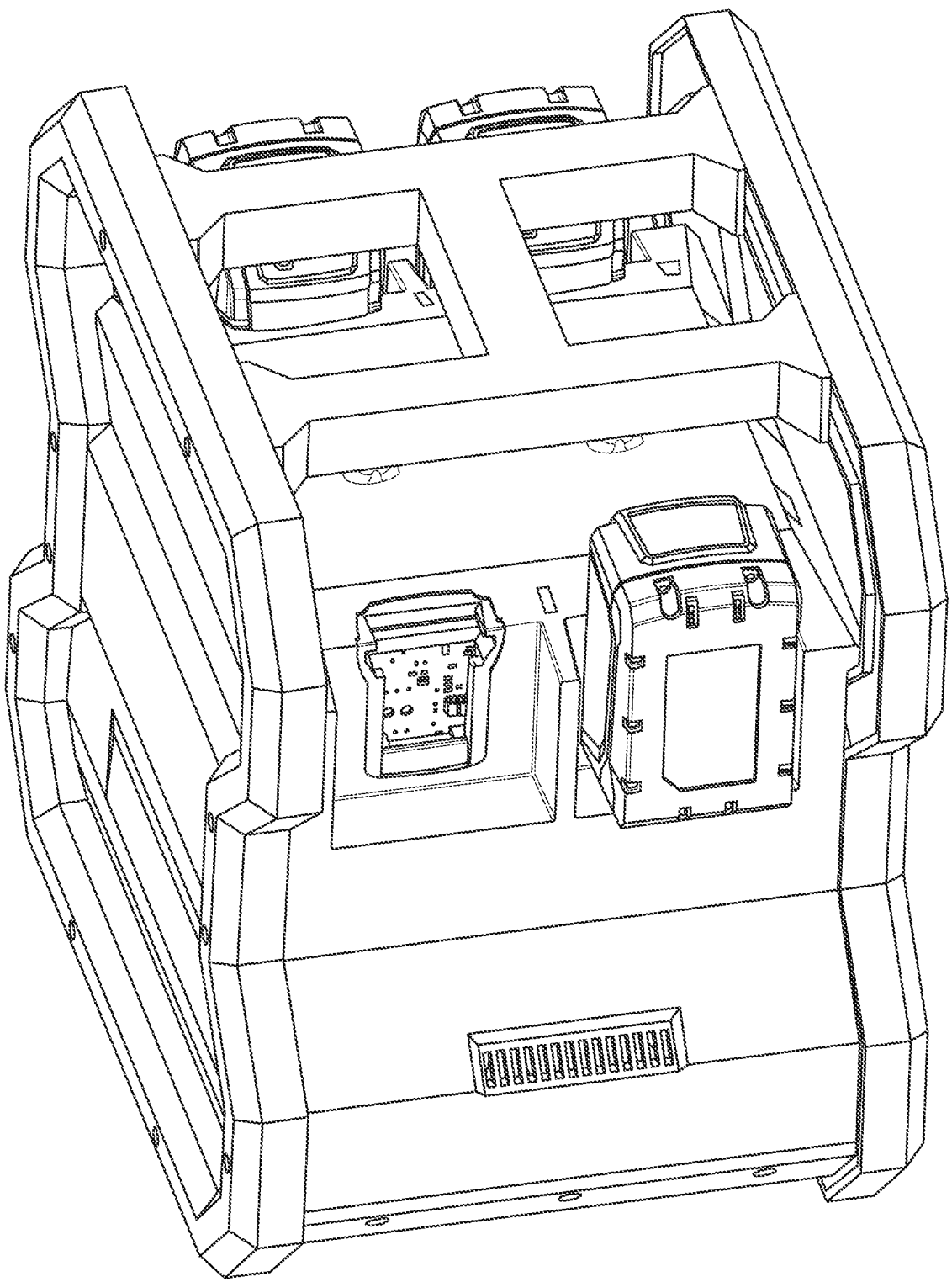
FIG. 1K is a perspective view of the portable power source of FIG. 1 with a battery pack removed.
Figure 1L:
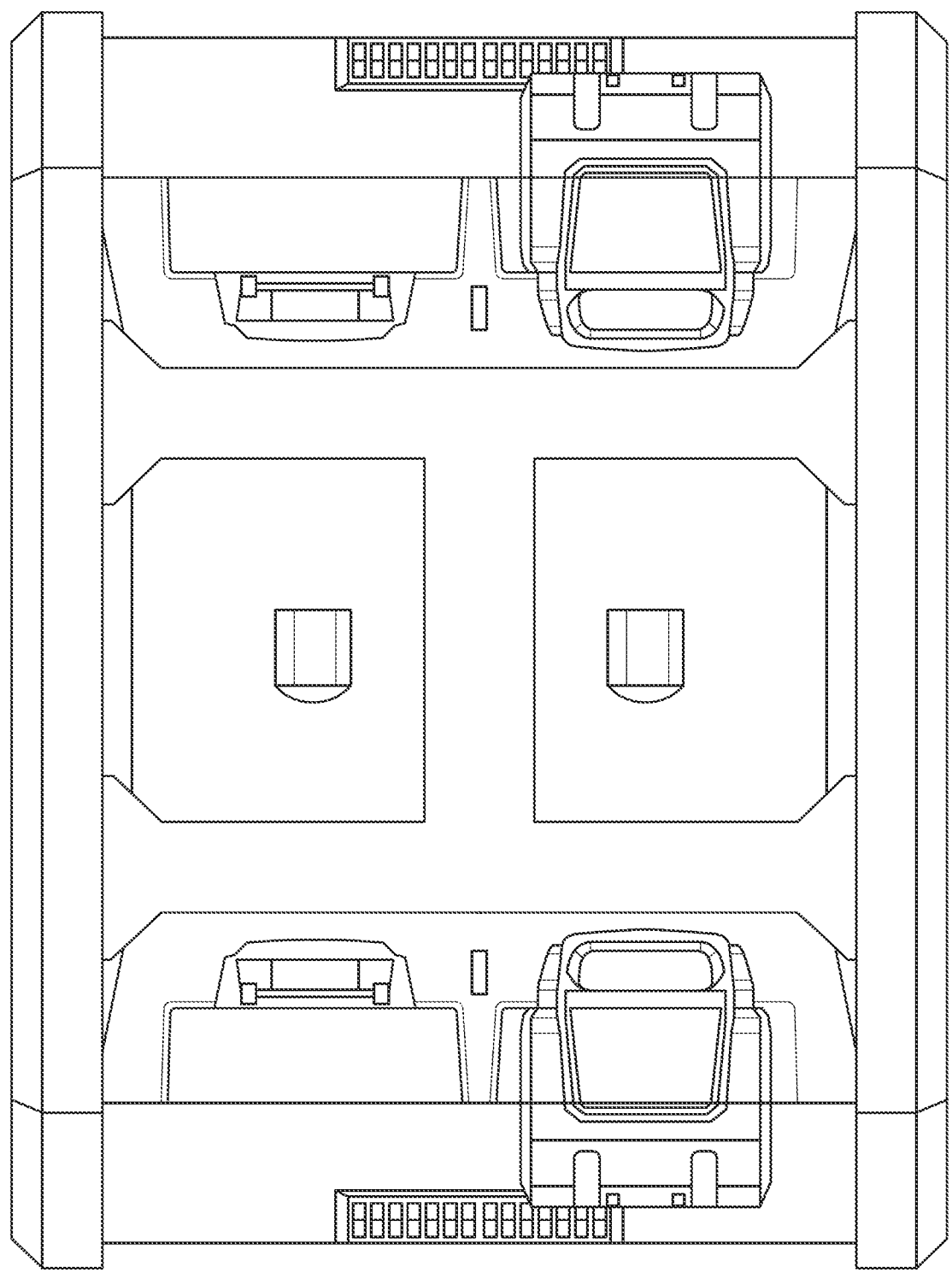
FIG. 1L is a top view of the portable power source of FIG. 1 with a number of battery packs removed.

When the handle 324 is in the closed position, the portable power source 300 is capable of receiving a battery pack in each of a plurality of battery pack supports (see FIG. 1C for a similar portable power source with four battery packs 14A-14D connected to four battery pack supports 46A-46D, respectively). The handle 324 also includes a locked position 328 and an unlocked position 332. The handle 324 is illustrated in the locked position 328 in FIG. 10B. To enter the locked position 328, the handle 324 is rotated with respect to the second handle support member 320 such that the handle 324 prevents the first handle support member 316 and the second handle support member 320 from moving with respect to one another. In the locked position 328, the handle 324 forms a rigid structure with the first handle support member 316 and the second handle support member 320. The handle 324 is illustrated in the unlocked position 332 in FIG. 10C. To enter the unlocked position 332, the handle 324 is rotated with respect to the second handle support member 320 such that the handle 324 permits the first handle support member 316 and the second handle support member 320 to move with respect to one another. In the unlocked position 332, the handle 324 is able to be moved from the closed position (see FIG. 10A) to an open position.

Figure 10D:
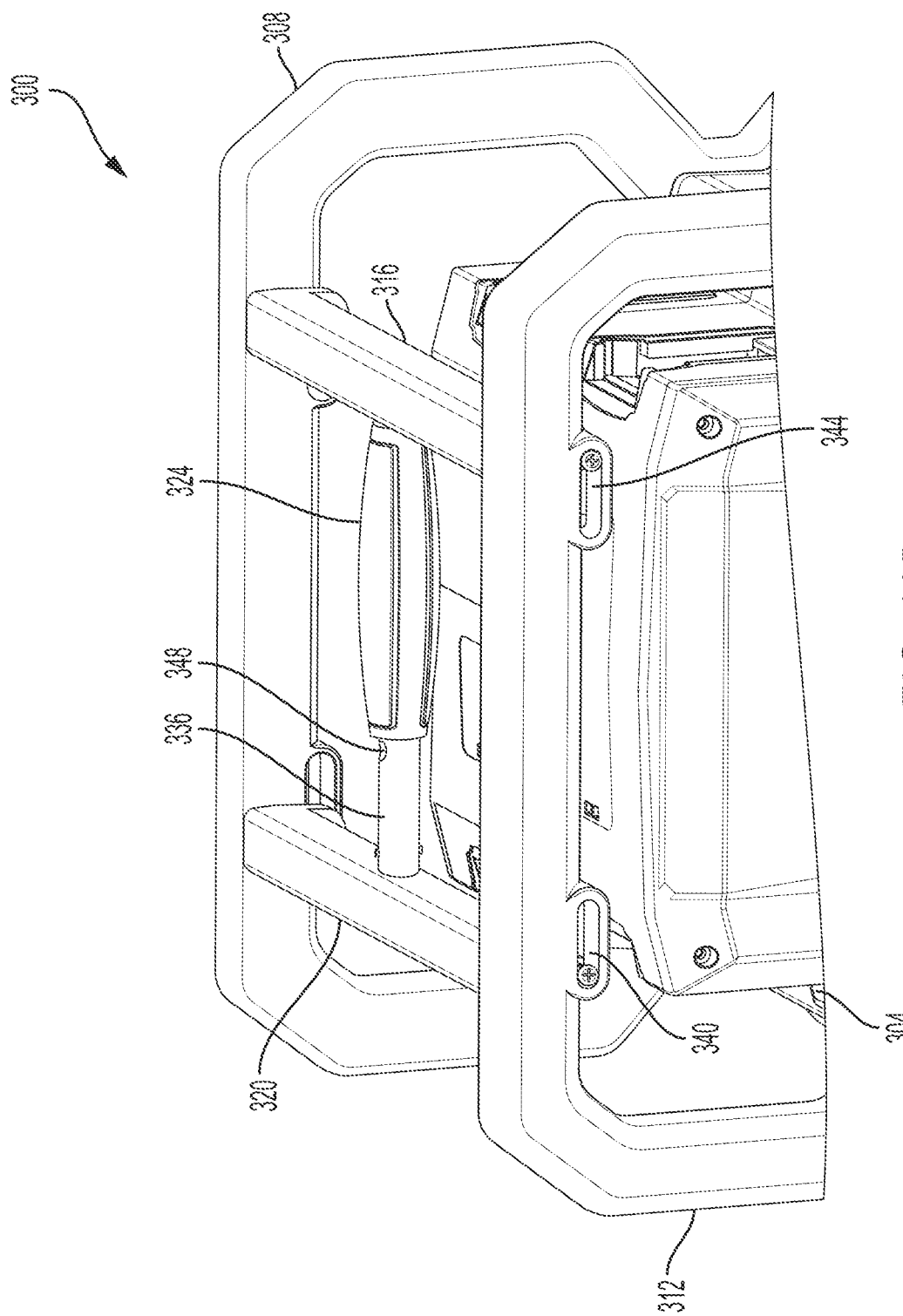
FIG. 10D illustrates the lockable handle of FIG. 10A in an unlocked and open position.

FIG. 10D illustrates the handle 324 in the open position. When the handle 324 is in the open position, the first handle support member 316 and the second handle support member 320 move with respect to one another to increase a distance between the first handle support member 316 and the second handle support member 320. In some embodiments, both the first handle support member 316 and the second handle support member 320 are movable. In other embodiments, only one of the first handle support member 316 and the second handle support member 320 is movable. As shown in FIG. 10D, the handle 324 includes an internal rod or member 336 that is extended out of the handle 324 when the handle portion is in the open position. The member 336 is enclosed within the handle 324 when the handle 324 is in the closed position (see FIG. 10A).

In some embodiments, moving the handle 324 between the closed position and the open position causes the first handle support member 316 and the second handle support member 320 to function as lock or retention members for one or more battery packs (e.g., battery packs 14A-14D) similar to the manner illustrated in FIGS. 9C and 9D. In such embodiments, the first handle support member 316 and the second handle support member 320 are configured as mechanical interlocks that can be used to physically prevent a battery pack from being connected to or removed from the portable power source 300.

Figure 10E:
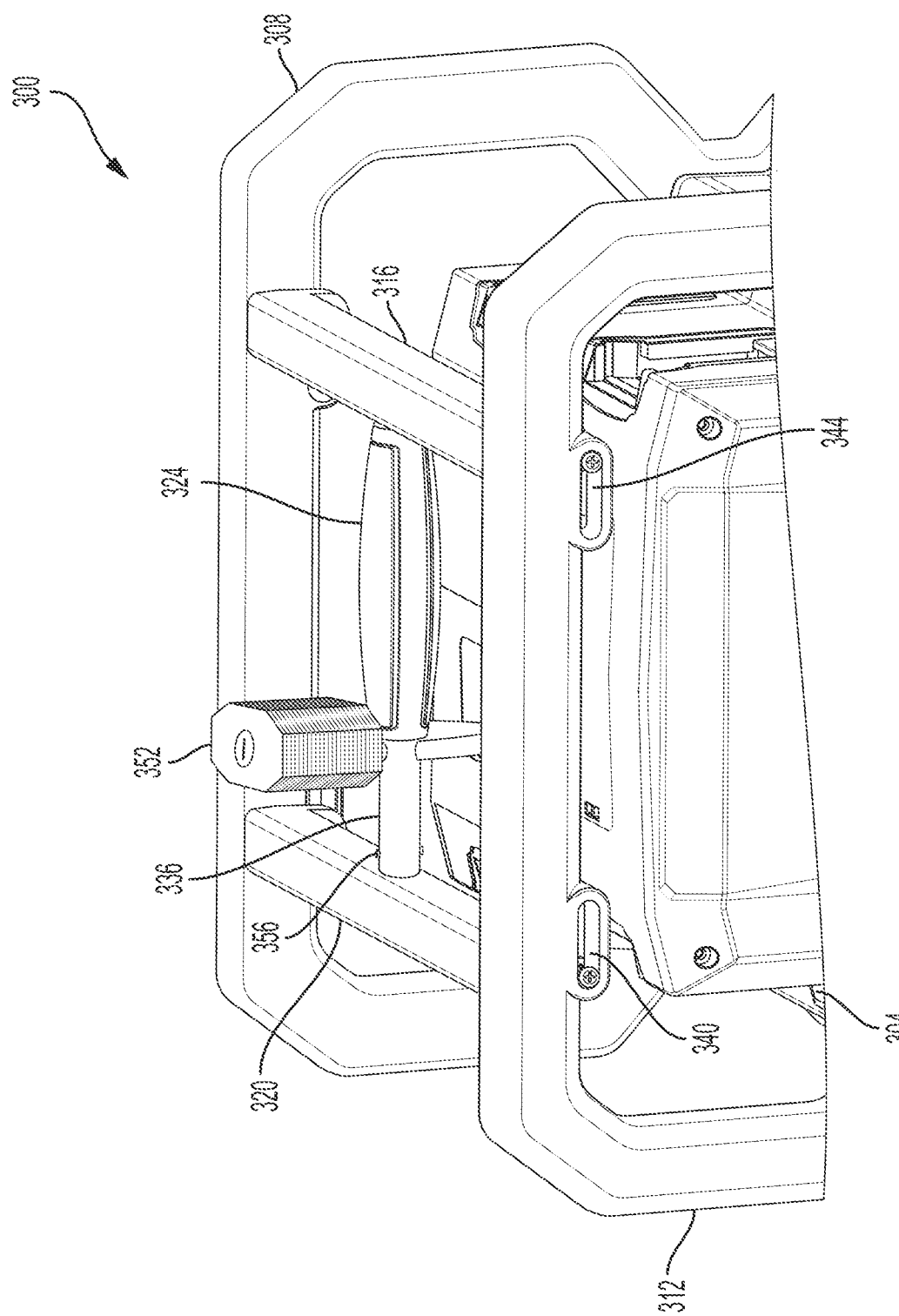
FIG. 10E illustrates the lockable handle of FIG. 10A being held in the unlocked and open position using a padlock.

FIG. 10D illustrates the portable power source 300 including a first aperture 340 and a second aperture 344 that function as guides for the movement of the first handle support member 316 and the second handle support member 320. The first aperture 340 and second aperture 344 receive a portion of the second handle support member 320 and the first handle support member 316, respectively, to allow the first handle support member 316 and the second handle support member 320 to move or slide with respect to one another. The first aperture 340 and the second aperture 344 are illustrated in FIG. 10D with respect to the second frame member 312. Corresponding first and second apertures are similarly included on the first frame member 308. As also illustrated in FIG. 10D, the member 336 includes an aperture or lock receiving portion 348. As illustrated in FIG. 10E, a padlock 352 or similar locking mechanism can be inserted into the aperture 348 to hold the handle 324 in the open position.

Figure 10F:
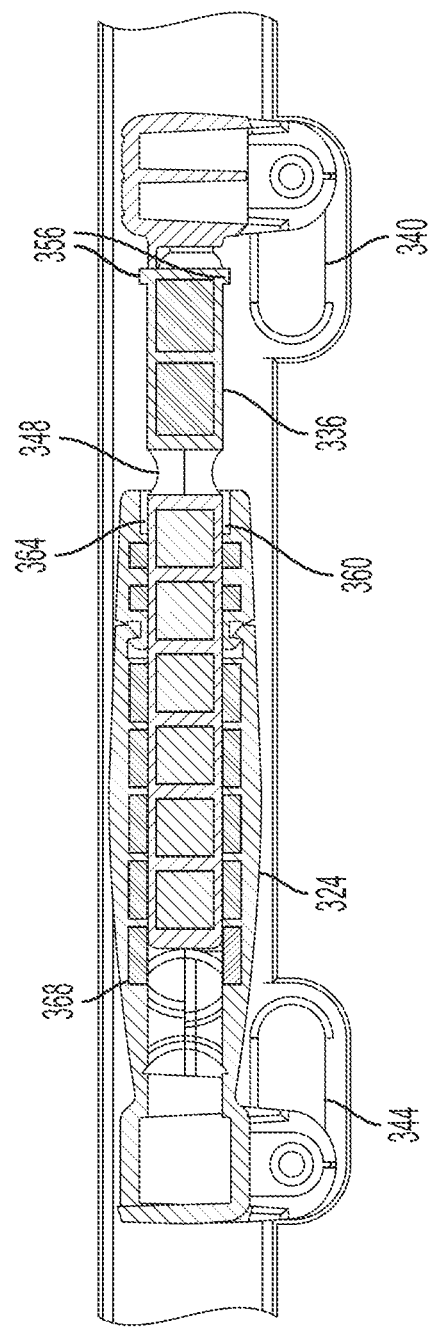
FIG. 10F is a cross-sectional view of the lockable handle of FIG. 10A in unlocked and open position.

FIG. 10F illustrates a cross-sectional view of the handle 324 in the open position. The handle 324 includes projections 356 on the member 336. The projections 356 on the member 336 can be received in apertures 360 and 364 when the handle 324 is in the closed position. A resilient or bias member (e.g., a spring) 368 is included within the handle 324. In some embodiments, the resilient member 368 biases the handle 324 into the locked position 328. In other embodiments, the resilient member 368 biases the handle 324 into the unlocked position 332. Regardless of the manner in which the resilient member 368 biases the handle 324, the projections 356 can be received in the apertures 360, 364 and the handle 324 can be rotated. By rotating the handle 324, the handle 324 can be held in either the locked position 328 or the unlocked position 332 (e.g., by respective grooves within the apertures 360, 364 that receive protections 356 for countering the force from the resilient member 368).

In some embodiments, the peak power output of the portable power source 10, 200, 300 with all battery packs 14 (e.g., four "5S2P" battery packs 14) is within a range of about 3000 W to about 4000 W (e.g., 3400 W) for a short period of time of between about 2 s and about 4 s (e.g., 3 s). In such configurations, the portable power source 10, 200, 300 can provide a peak output power of about 3600 W for at least about 3.5 s.

In some embodiments, the sustained or continuous maximum output power of the portable power source 10, 200, 300 with all battery packs 14 is within a range of about 1500 W to about 2000 W. In some embodiments, the sustained or continuous maximum output power is about 1800 W. A runtime at maximum output power for the portable power source 10, 200, 300 with all battery packs 14 is within a range of about 18 minutes to about 21 minutes (e.g., about 20.5 minutes).

In some embodiments, the peak power output of the portable power source 10, 200, 300 with optional battery pack support(s) without an operational battery pack 14 (e.g., with three "5S2P" battery packs 14) is within a range of about 3000 W to about 4000 W (e.g., 3400 W) for a short period of time of between about 2 s and about 4 s (e.g., 3 s). In such configurations, the portable power source 10, 200, 300 can provide a peak output power of about 3600 W for at least about 3.5 s.

In some embodiments, the sustained or continuous maximum output power of the portable power source 10, 200, 300 with optional battery pack support(s) without an operational battery pack 14 (e.g., with three battery packs 14) is within a range of about 1500 W to about 2000 W. In some embodiments, the sustained or continuous maximum output power is about 1800 W. A runtime at maximum output power for the portable power source 10, 200, 300 with all battery packs 14 is within a range of about 18 minutes to about 21 minutes (e.g., about 20.5 minutes).

The portable power source 10, 200, 300 is operable with different configurations of battery packs 14. With "5S1P" battery pack(s) 14, the output power and/or the run time of the portable power source 10, 200, 300 is reduced when compared to the "5S2P" battery packs 14. When "5S3P" battery packs 14 are used, the output power and/or the run time of the portable power source 10, 200, 300 is increased when compared to the "5S2P" battery packs 14.

The portable power source 10, 200, 300 may be operable to provide a variable output. The output (e.g., the maximum continuous output power, maximum peak output power, etc.) of the portable power source 10, 200, 300 may be adjusted based on the number of operable battery packs 14 connected to the portable power source 10, 200, 300. For example, with the maximum (four) battery packs 14, the portable power source 10, 200, 300 may have a maximum continuous output power of about 1600 W to about 2700 W. With fewer battery packs 14, the portable power source 10, 200, 300 may be operated to limit the maximum continuous output power—about 1200 W to about 2000 W with three battery packs 14, about 800 W to about 1350 W with two battery packs 14, about 400 W to about 700 W with one battery pack 14. In some embodiments, a maximum peak output power of the portable power source 10, 200, 300 is approximately 3600 W over a short period of time (e.g., approximately 3 to 5 seconds) when three or four battery packs 14 are connected to the portable power source 10, 200, 300. In other embodiments, the maximum peak output power of the portable power source 10, 200, 300 over a short period of time (e.g., approximately 3 to 5 seconds) is between 3000 W and 4200 W.

Variable output of the portable power source 10, 200, 300 may be achieved in various ways. For example, the portable power source 10, 200, 300 may be configured with parallel-connected battery packs 14 electrically connected to parallel-connected, in-phase inverters (e.g., four 400 W inverters connected in parallel). In another example, the input voltage of the battery pack(s) 14 may be provided to a single inverter with a controlled (e.g., electrically controlled) output.

Thus, the embodiments described herein may provide, among other things, a battery-powered portable power source. Although certain preferred embodiments have been described in detail, variations and modifications exist within the scope and spirit of one or more independent aspects of the embodiments described herein.

One or more independent features and/or independent advantages of the embodiments described herein are set forth in the following claims.

What is claimed is:

1. A portable power source comprising:
   a housing;
   a first battery pack support configured to receive a first removable and rechargeable battery pack;
   a second battery pack support configured to receive a second removable and rechargeable battery pack;
   a first handle support member;
   a second handle support member;
   a handle including an open position and a closed position, the first removable and rechargeable battery pack is able to be removed from the first battery pack support when the handle is in the closed position, and the first removable and rechargeable battery pack is prevented from being removed from the first battery pack support when the handle is in the open position;
   an inverter within the housing, the inverter configured to receive output power from the first removable and rechargeable battery pack and the second removable and rechargeable battery pack, the inverter configured to produce an alternating current power output; and
   an alternating current power outlet configured to receive the alternating current power output from the inverter, wherein the inverter is configured to be disabled when the first removable and rechargeable battery pack is received in the first battery pack support and the second removable and rechargeable battery pack is not received in the second battery pack support.

2. The portable power source of claim 1, wherein the inverter is configured to be enabled when the first removable and rechargeable battery pack is received in the first battery pack support and the second removable and rechargeable battery pack is received in the second battery pack support.

3. The portable power source of claim 1, further comprising:
   a third battery pack support configured to receive a third removable and rechargeable battery pack; and
   a fourth battery pack support configured to receive a fourth removable and rechargeable battery pack.

4. The portable power source of claim 3, wherein the inverter is configured to be enabled when the first removable and rechargeable battery pack is not received in the first battery pack support, the second removable and rechargeable battery pack is received in the second battery pack support, the third removable and rechargeable battery pack is received in the third battery pack support, and the fourth removable and rechargeable battery pack is received in the fourth battery pack support,
   wherein the inverter is configured to be disabled when the first removable and rechargeable battery pack is received in the first battery pack support, the second removable and rechargeable battery pack is received in the second battery pack support, the third removable and rechargeable battery pack is not received in the third battery pack support, and the fourth removable and rechargeable battery pack is not received in the fourth battery pack support.

5. The portable power source of claim 1, further comprising a first frame member and a second frame member,
   wherein the handle extends between and perpendicular to the first handle support member and the second handle support member, and
   wherein the first handle support member and the second handle support member are positioned perpendicularly between the first frame member and the second frame member.

6. The portable power source of claim 1, wherein the handle is configured to be rotatable between a locked position where the first handle support member and the second handle support member are not movable with respect to one another, and an unlocked position where the first handle support member and the second handle support member are movable with respect to one another.

7. The portable power source of claim 1, further comprising:
   a user interface that includes:
      a direct current power outlet,
      the alternating current power outlet, and
      one or more indicators.

8. The portable power source of claim 7, wherein the one or more indicators include a wireless connection indicator.

9. The portable power source of claim 7, wherein the user interface further includes a fuel gauge associated with the first removable and rechargeable battery pack and the second removable and rechargeable battery pack.

10. The portable power source of claim 1, wherein the first battery pack support includes an interface movable with respect to the housing between an extended position and a retracted position.

11. The portable power source of claim 1, wherein a maximum continuous output power of the portable power source is between approximately 1600 W and approximately 2700 W.

12. The portable power source of claim 1, wherein a maximum peak output power of the portable power source is between approximately 3000 W and approximately 4200 W.

13. A portable power source comprising:
a housing;
a first handle support member;
a second handle support member;
a handle configured to be rotatable between a locked position where the first handle support member and the second handle support member are not movable with respect to one another, and an unlocked position where the first handle support member and the second handle support member are movable with respect to one another;
a first battery pack support configured to receive a first removable and rechargeable battery pack;
a second battery pack support configured to receive a second removable and rechargeable battery pack;
an inverter within the housing, the inverter configured to receive output power from the first removable and rechargeable battery pack and the second removable and rechargeable battery pack, the inverter configured to produce an alternating current power output; and
an alternating current power outlet configured to receive the alternating current power output from the inverter,
wherein the inverter is configured to be disabled when the first removable and rechargeable battery pack is received in the first battery pack support and the second removable and rechargeable battery pack is not received in the second battery pack support.

14. The portable power source of claim 13, wherein the inverter is configured to be enabled when the first removable and rechargeable battery pack is received in the first battery pack support and the second removable and rechargeable battery pack is received in the second battery pack support.

15. The portable power source of claim 13, further comprising:
a user interface that includes:
the alternating current power outlet, and
one or more indicators.

16. The portable power source of claim 15, wherein the one or more indicators include a wireless connection indicator.

17. The portable power source of claim 13, wherein:
the handle includes an open position and a closed position, and
when the handle is in the open position, the first removable and rechargeable battery pack is prevented from being removed from the first battery pack support.

18. A portable power source comprising:
a housing;
a first battery pack support configured to receive a first removable and rechargeable battery pack;
a second battery pack support configured to receive a second removable and rechargeable battery pack;
a third battery pack support configured to receive a third removable and rechargeable battery pack;
a fourth battery pack support configured to receive a fourth removable and rechargeable battery pack;
a handle that includes an open position and a closed position, and the first removable and rechargeable battery pack is prevented from being removed from the first battery pack support when the handle is in the open position;
an inverter within the housing, the inverter configured to receive output power from the first removable and rechargeable battery pack, the second removable and rechargeable battery pack, the third removable and rechargeable battery pack, and the fourth removable and rechargeable battery pack, the inverter configured to produce an alternating current power output;
an alternating current power outlet configured to receive the alternating current power output from the inverter; and
a user interface that includes a fuel gauge, the fuel gauge configured to
display information associated with at least one of the first removable and rechargeable battery pack, the second removable and rechargeable battery pack, the third removable and rechargeable battery pack, and the fourth removable and rechargeable battery pack, and
display an indication corresponding to which of the at least one of the first removable and rechargeable battery pack, the second removable and rechargeable battery pack, the third removable and rechargeable battery pack, and the fourth removable and rechargeable battery pack the information is associated.

19. The portable power source of claim 18, wherein the inverter is configured to be enabled when the first removable and rechargeable battery pack is received in the first battery pack support, the second removable and rechargeable battery pack is received in the second battery pack support, the third removable and rechargeable battery pack is received in the third battery pack support, and the fourth removable and rechargeable battery pack is received in the fourth battery pack support.

20. The portable power source of claim 18, wherein the user interface includes a wireless connection indicator.

* * * * *